(12) United States Patent
Miyakawa et al.

(10) Patent No.: US 6,522,589 B1
(45) Date of Patent: Feb. 18, 2003

(54) SEMICONDUCTOR APPARATUS AND MODE SETTING METHOD FOR SEMICONDUCTOR APPARATUS

(75) Inventors: Tadashi Miyakawa, Yokohama (JP); Yukihito Oowaki, Yokohama (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/961,356

(22) Filed: Sep. 25, 2001

(30) Foreign Application Priority Data

Sep. 27, 2000 (JP) .................................... 2000-293626

(51) Int. Cl.[7] ................................................ G11C 7/00
(52) U.S. Cl. .................. 365/189.07; 365/201; 365/241
(58) Field of Search ........................... 365/189.07, 201, 365/241

(56) References Cited

U.S. PATENT DOCUMENTS

| | | | |
|---|---|---|---|
| 4,317,200 A | * 2/1982 | Wakatsuki et al. ............ 714/736 |
| 5,161,159 A | 11/1992 | McClure et al. | |
| 5,373,472 A | 12/1994 | Ohsawa | |
| 5,661,729 A | * 8/1997 | Miyazaki et al. ............ 365/201 |
| 5,706,232 A | 1/1998 | McClure et al. | |
| 5,896,324 A | * 4/1999 | Jang et al. .............. 365/189.07 |
| 6,038,189 A | * 3/2000 | Morishita .............. 365/189.07 |

FOREIGN PATENT DOCUMENTS

JP 9-166648 6/1997

* cited by examiner

Primary Examiner—Huan Hoang
(74) Attorney, Agent, or Firm—Banner & Witcoff, Ltd.

(57) ABSTRACT

In a semiconductor apparatus, the first voltage detection circuit is configured to judge whether a potential of the input signal is higher or lower than a first reference potential, and output a first level signal if the potential of the input signal is judged to be higher. The second voltage detection circuit is configured to judge whether the potential of the input signal is higher or lower than a second reference potential, and output a second level signal if the potential of the input signal is judged to be lower. The operation mode entry setting circuit is configured to judge plural times whether or not output signals from the first and second voltage detection circuits coincide with predetermined levels in synchronization with an input clock signal, and make an enter of an operation mode if all of the judged-results show that the output signals coincide with the predetermined levels.

46 Claims, 25 Drawing Sheets

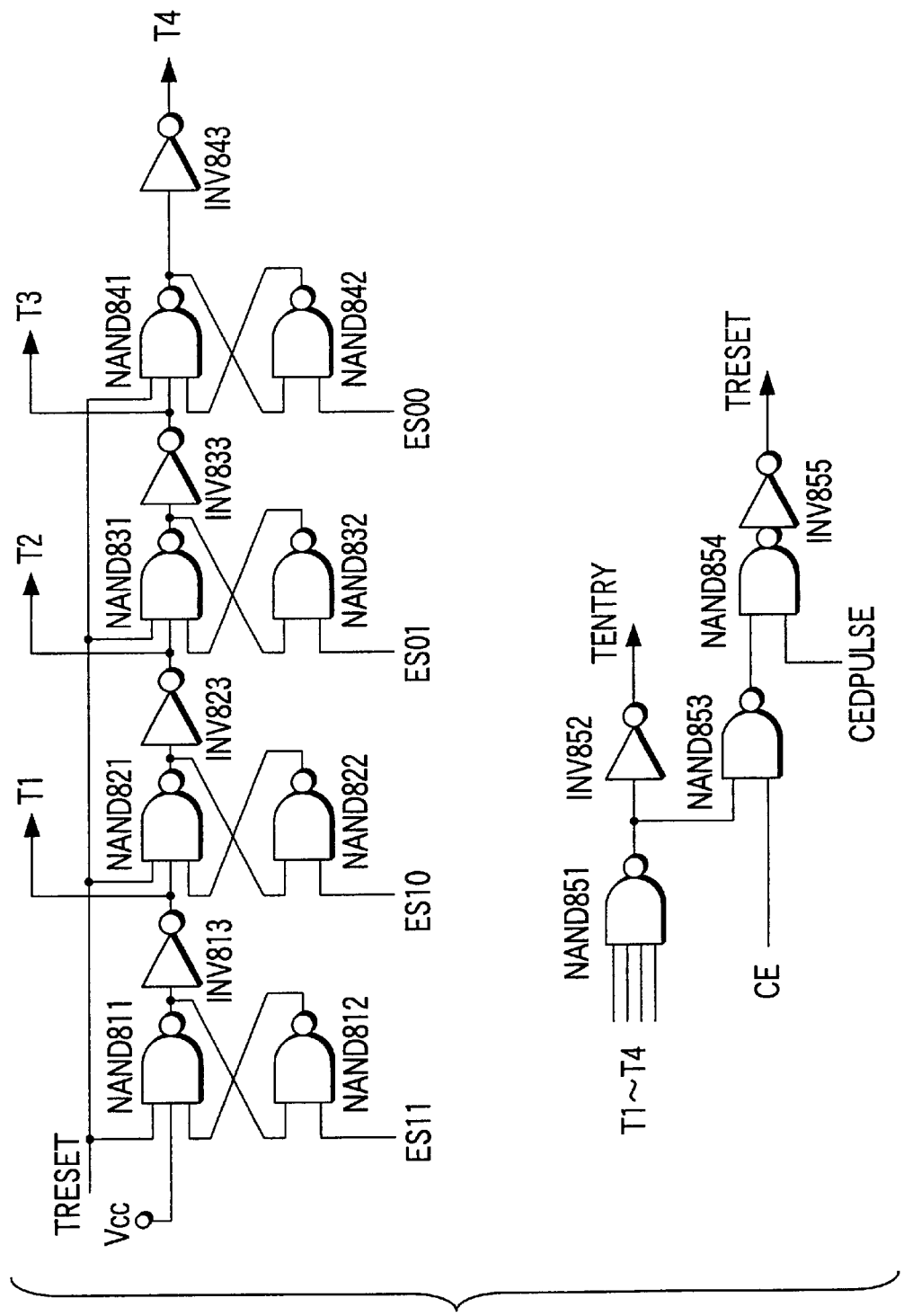
F I G. 12

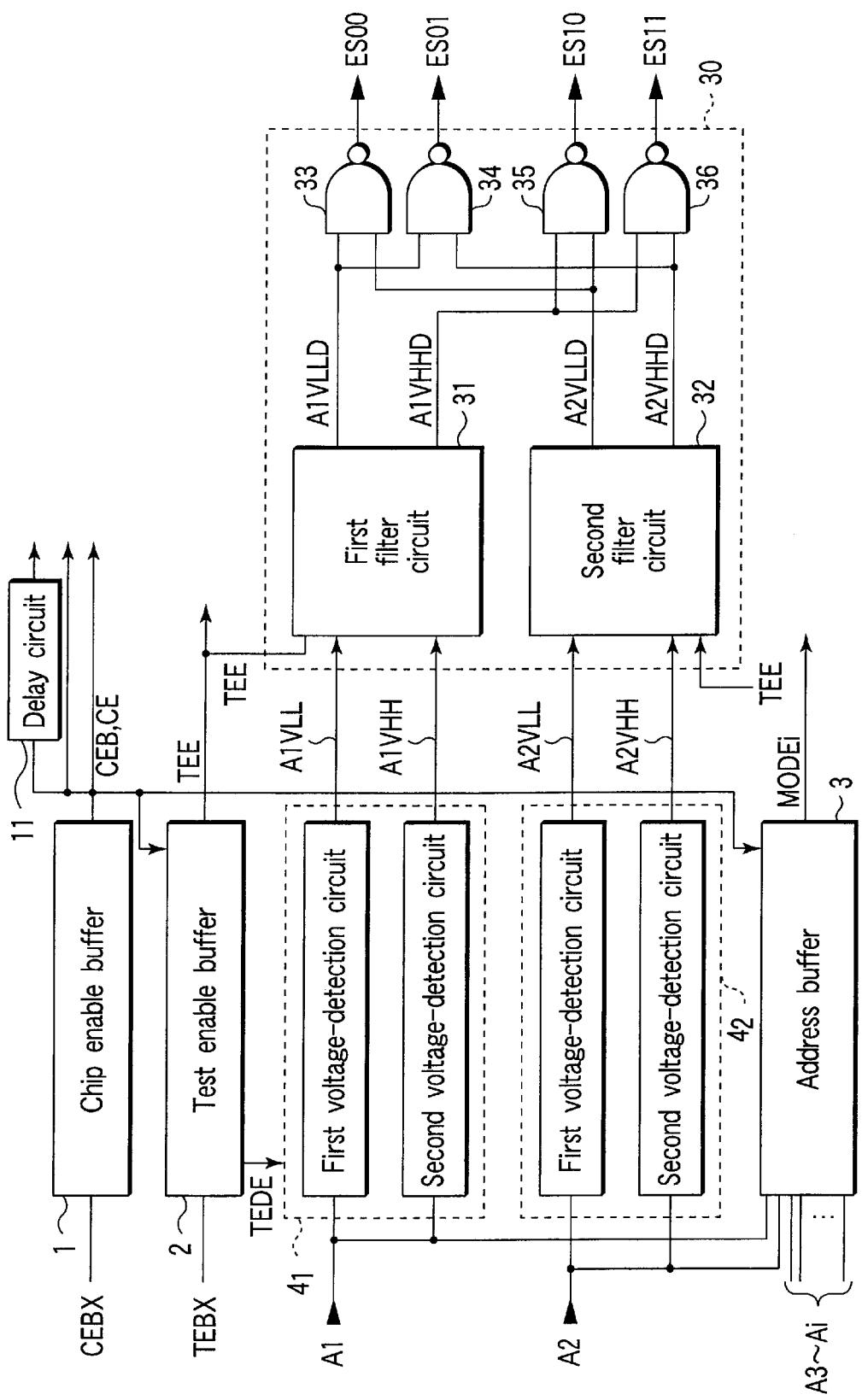
F I G. 16

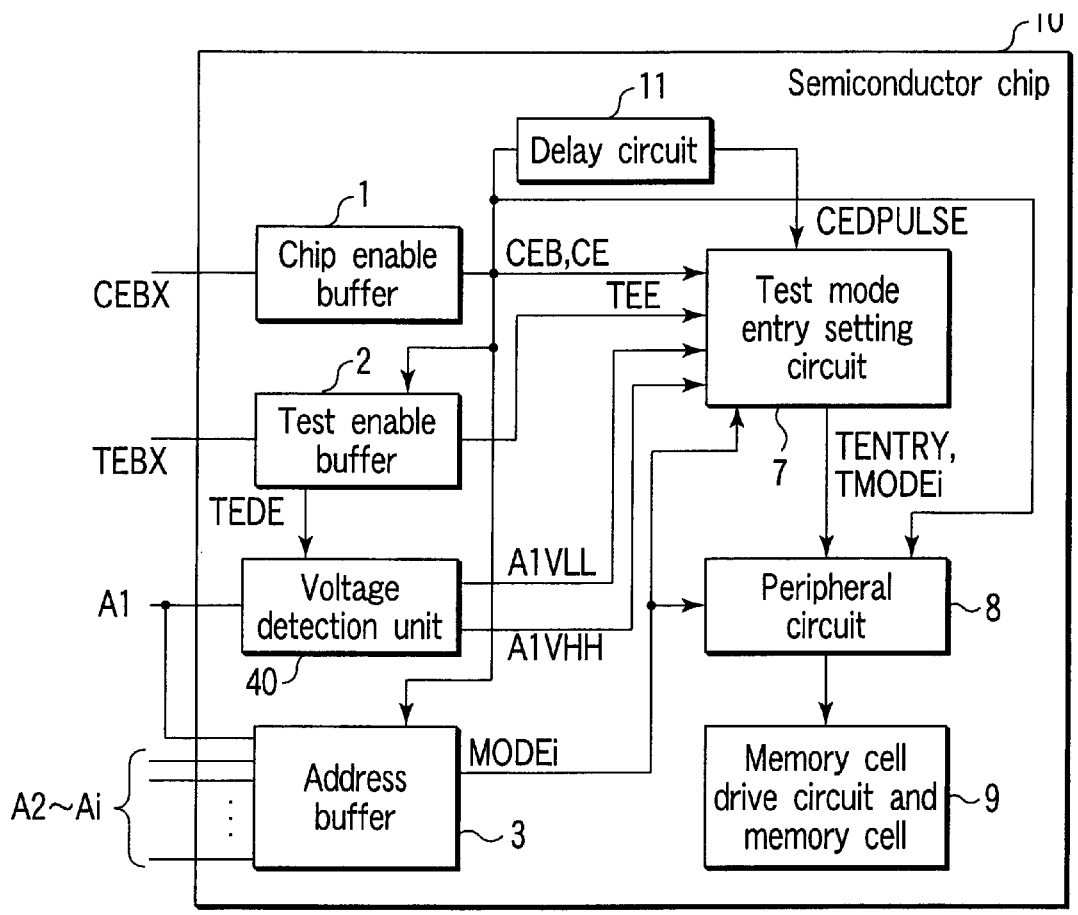
F I G. 18

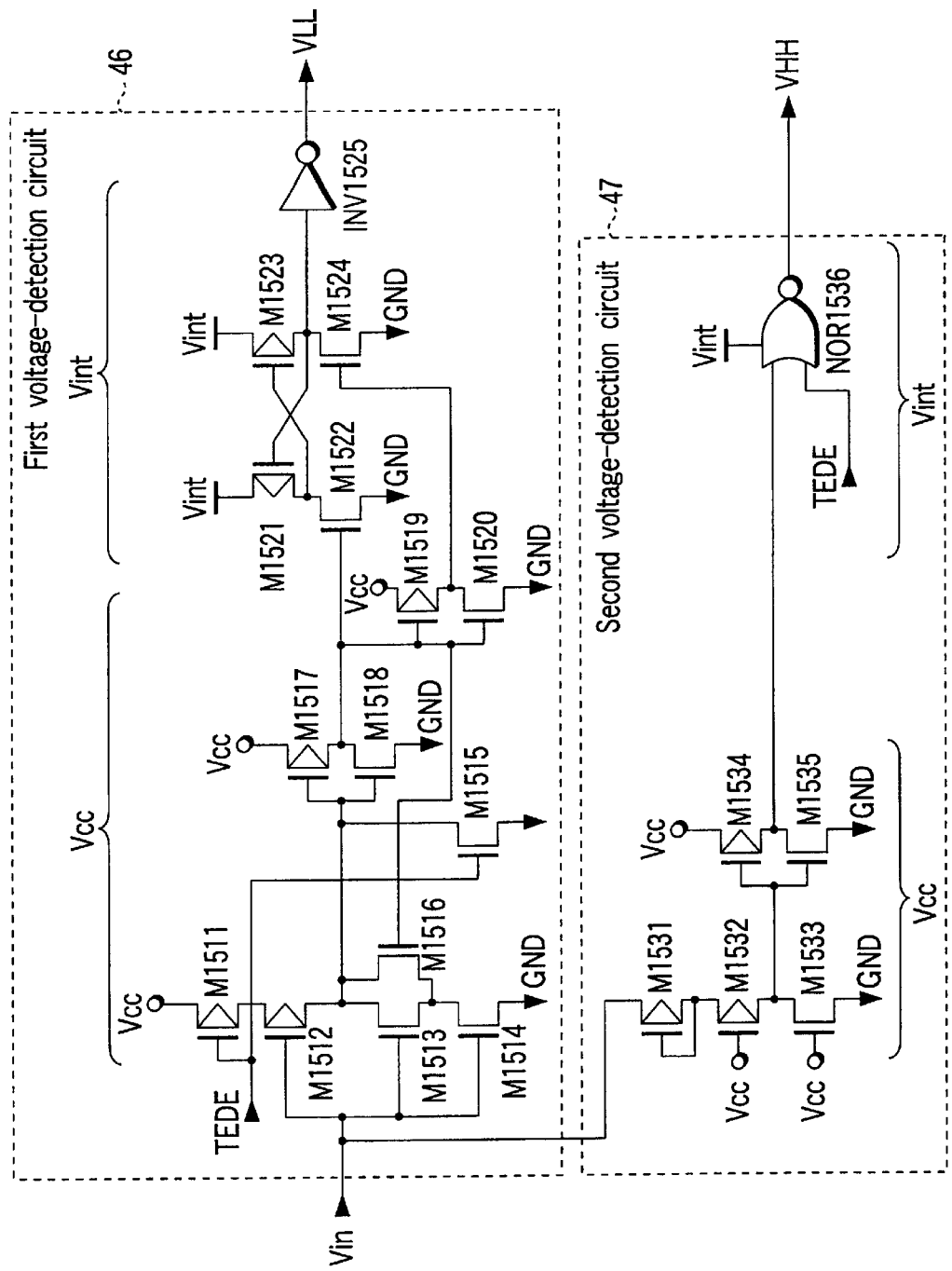
F I G. 19

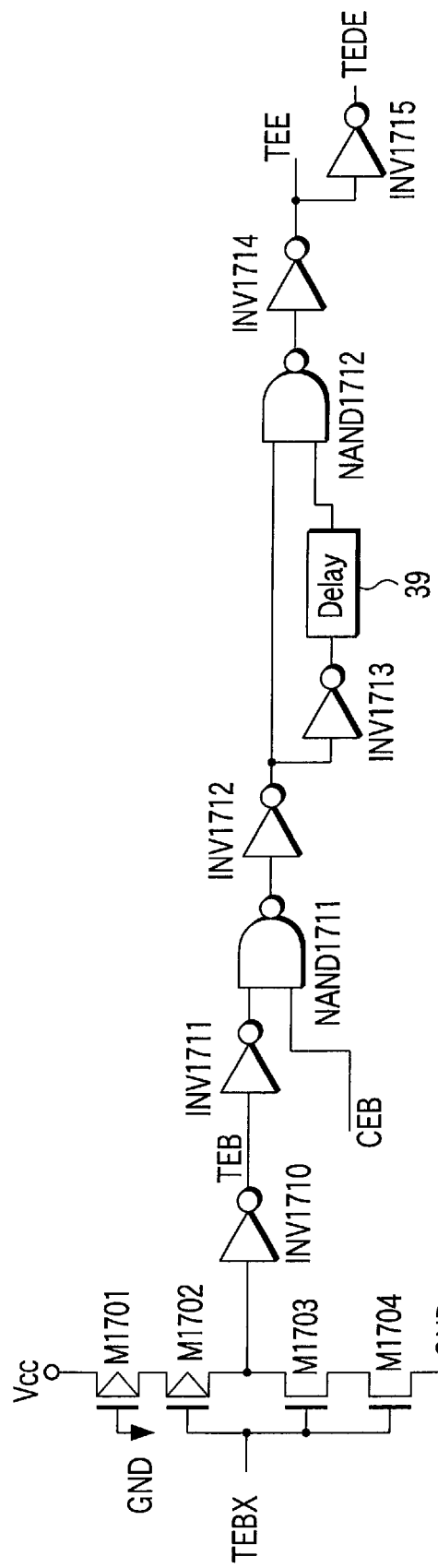
F I G. 20

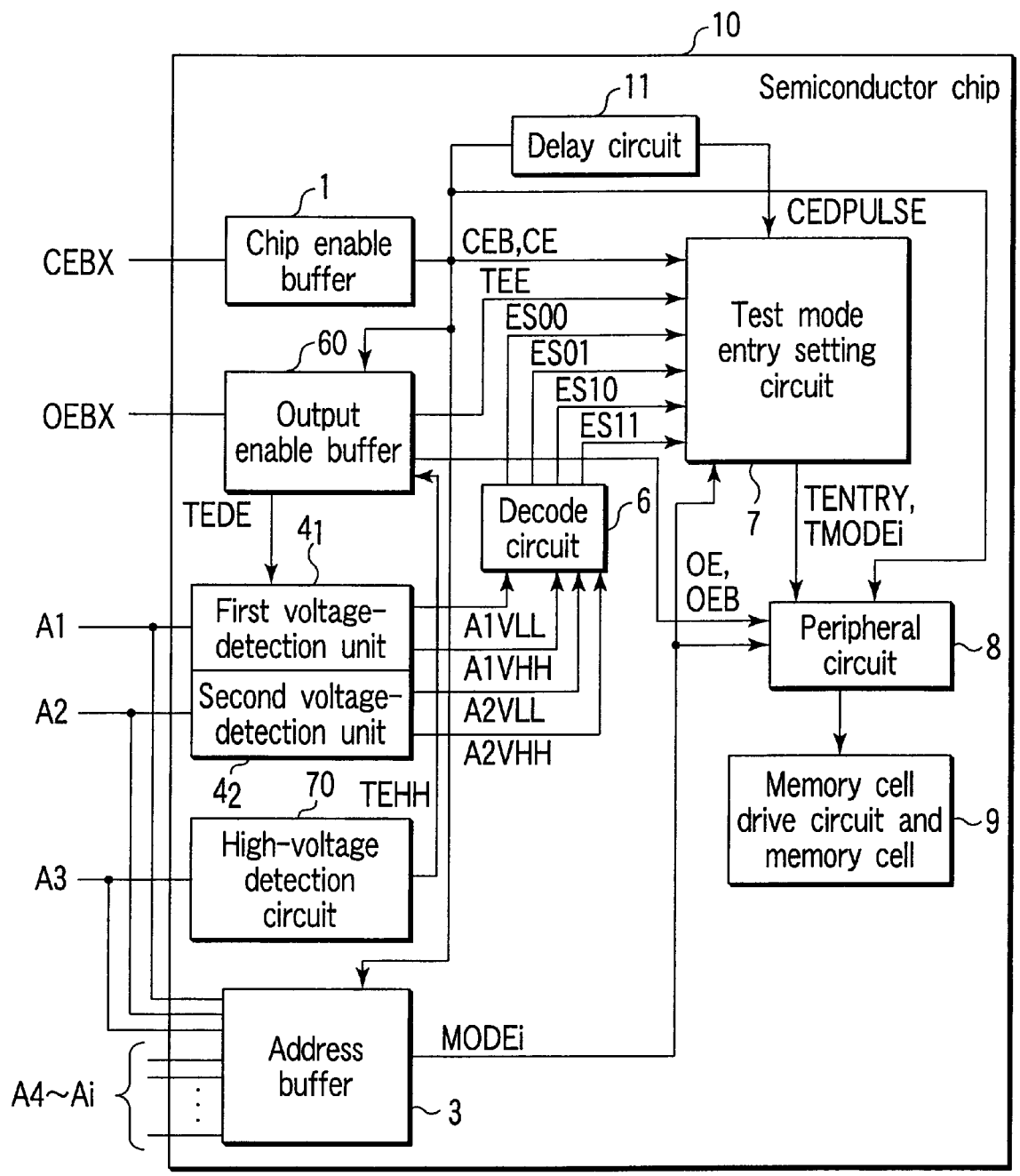
F I G. 25

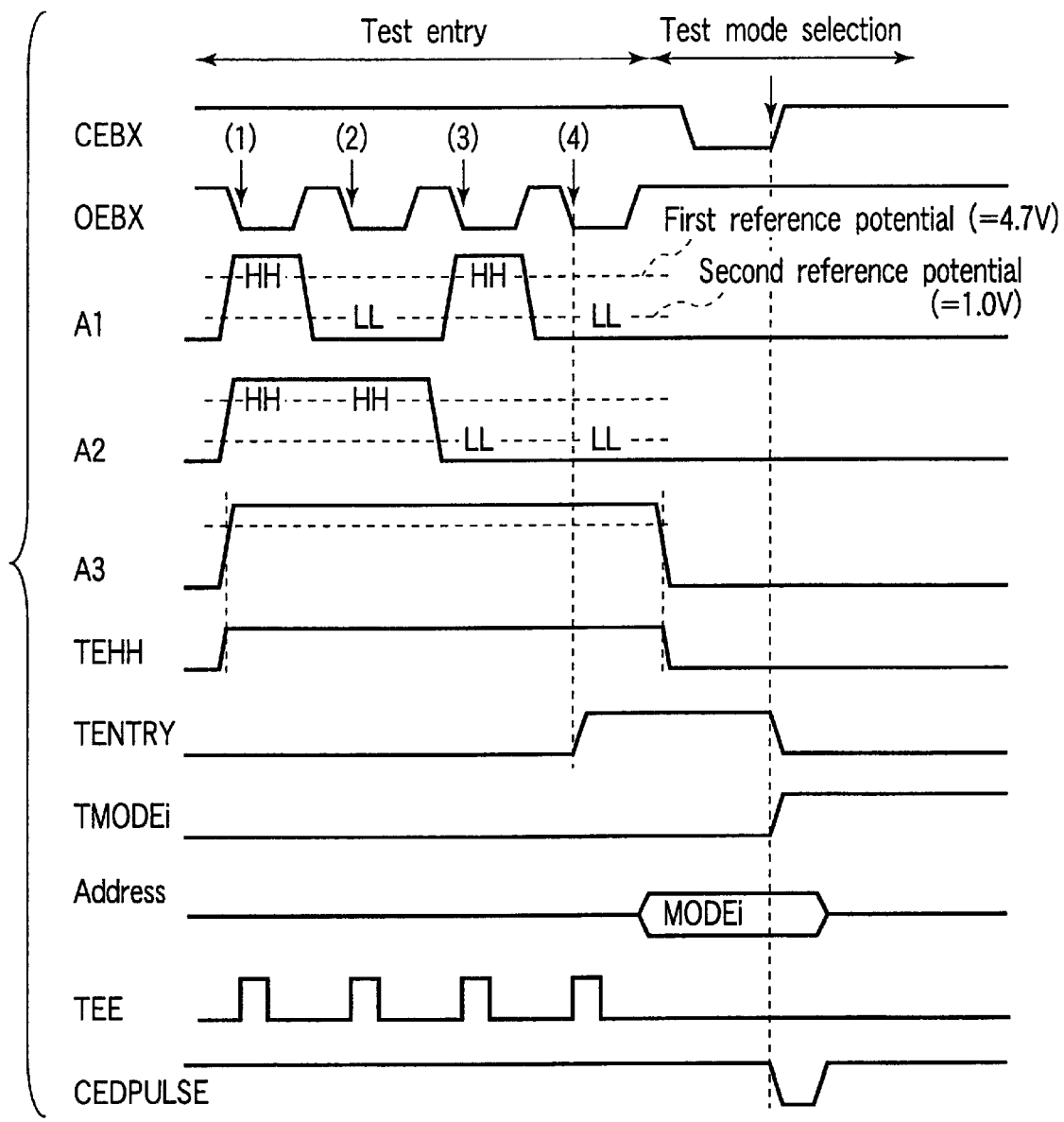
F I G. 26

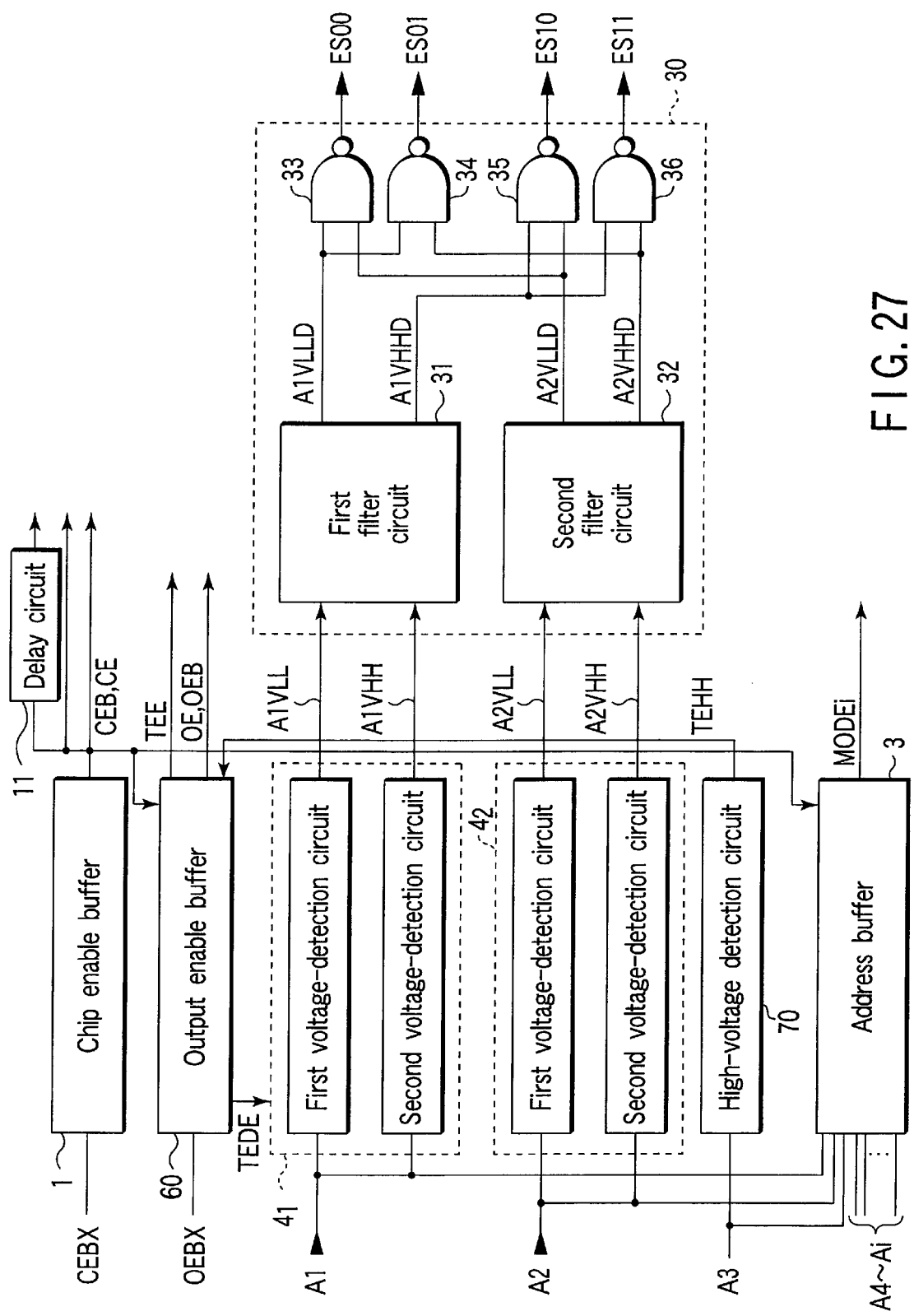
F I G. 27

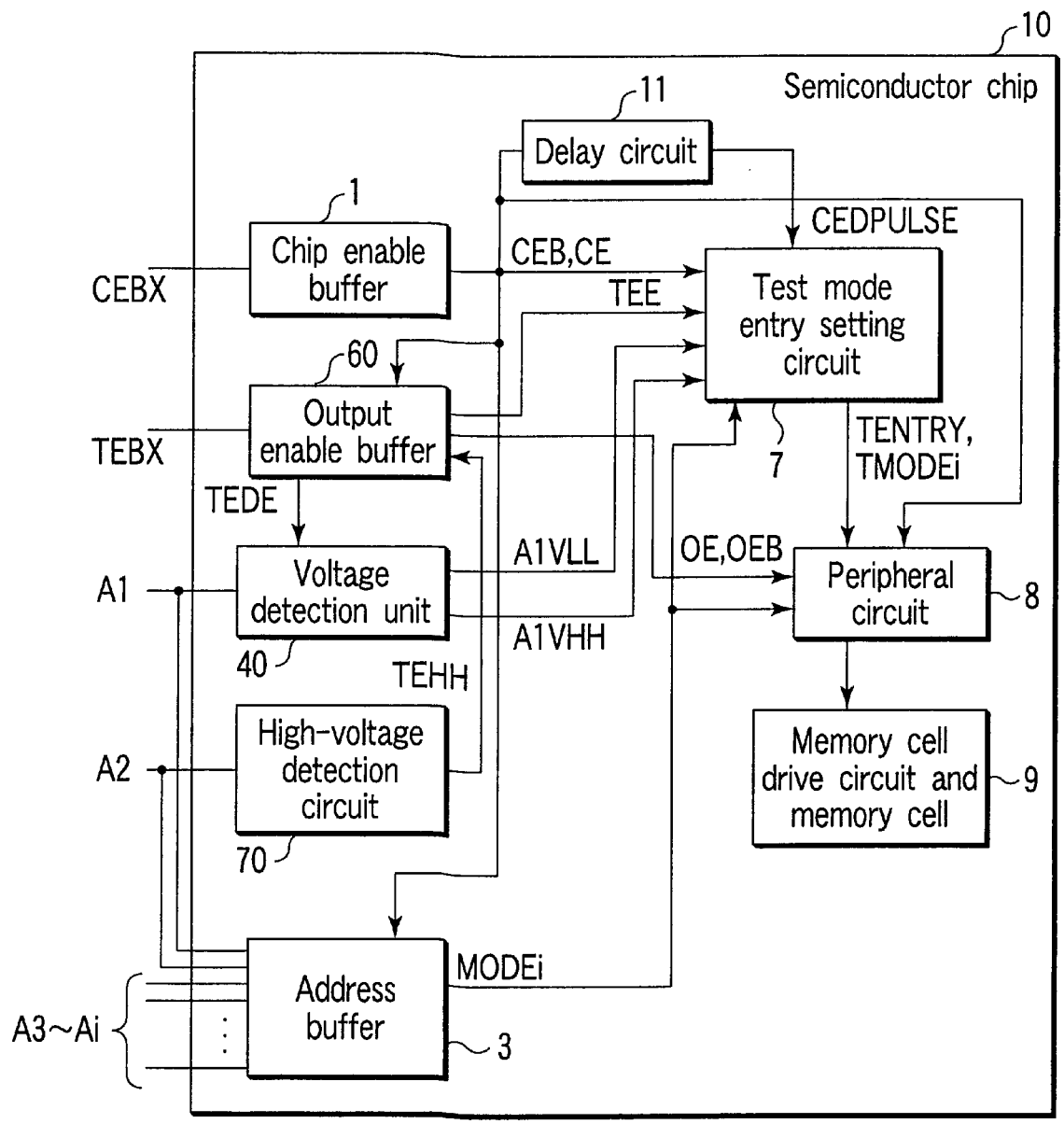
F I G. 29

US 6,522,589 B1

SEMICONDUCTOR APPARATUS AND MODE SETTING METHOD FOR SEMICONDUCTOR APPARATUS

CROSS-REFERENCE TO RELATED APPLICATIONS

This application is based upon and claims the benefit of priority from the prior Japanese Patent Application No. 2000-293626, filed Sep. 27, 2000, the entire contents of which are incorporated herein by reference.

BACKGROUND OF THE INVENTION

1. Field of the Invention

The present invention relates to a semiconductor apparatus that requires a mode setting operation, and more particularly to a semiconductor apparatus to which an operation mode is set on the basis of an input signal and a mode setting method for the semiconductor apparatus.

2. Description of the Related Art

The semiconductor apparatus has built-in plural sorts of test modes for a performance test executed by changing a voltage inside the apparatus and the like, and for a reliability test executed by adding stress and the like. Those test modes include a test of applying a surplus voltage to an element inside a chip, or a test of simultaneously selecting plural cells without depending on an external address.

In a conventional semiconductor apparatus having the test modes shown in FIG. 30, false generation and false suspension of a test mode signal due to a noise is prevented by using a high-voltage detection circuit and a low-voltage detection circuit.

Besides, in Jpn. Pat. Appln. KOKAI Publication No. 9-166648 discloses the above-mentioned semiconductor apparatus in its figures such as FIG. 1.

Two external terminals 101 and 102 being a terminal used for both normal operation and test operation are connected to an internal bus 117 via an inverter 103 and an inverter 106, respectively while being connected to a circuit group of a low-voltage detection circuit 104 and a high-voltage detection circuit 105 or to a circuit group of a low-voltage detection circuit 107 and a high-voltage detection circuit 108 for the test operation.

Here, output voltages $S_1$ and $S_4$ of the high-voltage detection circuits 105 and 108 become high in level when voltages $V_1$ and $V_2$ inputted from the external terminals 101 and 102 become higher than a source voltage Vcc, respectively. Output voltages $S_2$ and $S_3$ of the low-voltage detection circuits 104 and 107 become high in level when voltages $V_1$ and $V_2$ inputted from the external terminals 101 and 102 become lower than a ground voltage GND, respectively.

An output $S_2$ from the high-voltage detection circuit 105 and an output $S_3$ from the low-voltage detection circuit 107 are inputted to an AND circuit 109, and an output $S_1$ from the low-voltage detection circuit 104 and an output $S_4$ from the high-voltage detection circuit 108 are inputted to an AND circuit 110. The output $S_5$ from the AND circuit 109 is inputted to a set input end of a flip-flop 111, and the output $S_6$ from the AND circuit 110 is inputted to a reset input end of the flip-flop 111.

The external terminal 112 is inputted to the reset input end of the flip-flop 111. The output from the flip-flop 111 becomes a test mode signal T, and is supplied to a CPU 113, a program counter 114, a ROM 115, and a RAM 116 that are connected to each other by an internal bus 117.

After power charge, the voltage of the external terminal 112 is made high in level, and the flip-flop 111 is reset, initialized, and set to a user mode.

Then, when the voltage $V_1$ of the external terminal 101 is made abnormally high and the voltage $V_2$ of the external terminal 102 is made abnormally low in order to transit the mode from the user mode to the test mode, the output $S_2$ from the high-voltage detection circuit 105 and the output $S_3$ from the low-voltage detection circuit 107 both become high in level, and the output $S_5$ from the AND circuit 109 becomes high in level. Here, the flip-flop 111 is set, the test mode signal T becomes high in level, and the mode changes to the test mode.

In the case where the mode is transited from the test mode to the user mode, when the voltage $V_1$ of the external terminal 101 is made abnormally low and the voltage $V_2$ of the external terminal 102 is made abnormally high, the output $S_1$ from the low-voltage detection circuit 104 and the output $S_4$ from the high-voltage detection circuit 108 both become high in level, and the output $S_6$ from the AND circuit 110 becomes high in level. Here, the flip-flop 111 is reset, the test mode signal T becomes low in level, and the mode changes to the user mode.

In both the user mode and the test mode, even if a noise is given to the external terminals 101 and 102 at the same time from outside, the set state is not changed.

The conventional semiconductor apparatus as mentioned above has problems described below.

In a conventional test mode setting method, an external terminal for setting-up a test state is required for each of the necessary test modes so that there has been cases where it is not possible to meet the requirement when sorts of the required tests are diversified due to maximizing in size, speedup, and the like of the semiconductor apparatus.

Moreover, there has been a possibility that the test mode is set without the user's intention. Especially in a circuit for judging once whether the input signal is higher or lower than a reference value that is set and fixed, there has been a high risk of causing a false operation reacting to a little noise such as a swing of the power or a swing of a signal line when the voltage being close to the reference value is given.

In the semiconductor storage apparatus, a stress test and the like for a circuit element or a memory cell is prepared in a reliability test, a screening test before shipping products or the like, and depending on the sort of the test, there are cases where data until the memory cell data are destroyed under a test mode state are obtained. There has been a possibility that, if such a test condition is falsely set under a state where the semiconductor storage apparatus is used in a normal way, destruction of the memory cell data occurs.

Moreover, in a conventional technique shown in FIG. 30, a negative voltage is used as a low-voltage level, and the negative voltage must be prepared for the test mode setting. If a reference potential of the negative voltage is set to (Vcc−Vth), which is a threshold of a transistor, the negative reference voltage inclines greater to minus as a threshold voltage is set higher. When an absolute value of the negative reference voltage exceeds a forward voltage of a pn-junction of a source and a drain of the transistor, the negative voltage cannot be given anymore so that the test entry is not executed in a normal manner.

BRIEF SUMMARY OF THE INVENTION

According to a first aspect of the present invention, there is provided a semiconductor apparatus comprising a first voltage detection circuit to which an input signal is inputted, configured to judge whether a potential of the input signal is higher or lower than a first reference potential, and output a first level signal if the potential of the input signal is judged to be higher; a second voltage detection circuit to which the input signal is inputted, configured to judge whether the potential of the input signal is higher or lower than a second reference potential, and output a second level signal if the potential of the input signal is judged to be lower; and an operation mode entry setting circuit configured to judge plural times whether or not output signals from the first and second voltage detection circuits coincide with predetermined levels in synchronization with an input clock signal, and make an enter of an operation mode if all of the judged-results show that the output signals coincide with the predetermined levels.

According to a second aspect of the present invention, there is provided a semiconductor apparatus comprising a first voltage detection circuit to which a first input signal is inputted, configured to judge whether a potential of the input signal is higher or lower than a first reference potential, and output a first level signal if the potential of the input signal is judged to be higher; a second voltage detection circuit to which the first input signal is inputted, configured to judge whether the potential of the input signal is higher or lower than a second reference potential, and output a second level signal if the potential of the input signal is judged to be lower; a third voltage detection circuit to which a second input signal is inputted, configured to judge whether the potential of the input signal is higher or lower than the first reference potential, and output the first level signal if the potential of the input signal is judged to be higher; a fourth voltage detection circuit to which the second input signal is inputted, configured to judge whether the potential of the input signal is higher or lower than the second reference potential, and output the second level signal if the potential of the input signal is judged to be lower; and an operation mode entry setting circuit configured to judge plural times whether or not the output signals from the first to fourth voltage detection circuits coincide with predetermined levels in synchronization with an input clock signal, and make an enter of an operation mode if all of the judged-results show that the output signals coincide with the predetermined levels.

According to a third aspect of the present invention, there is provided a semiconductor apparatus comprising a first voltage detection circuit to which a first input signal is inputted, configured to judge whether a potential of the input signal is higher or lower than a first reference potential, and output a first level signal if the potential of the input signal is judged to be higher; a second voltage detection circuit to which the first input signal is inputted, configured to judge whether the potential of the input signal is higher or lower than a second reference potential, and output a second level signal if the potential of the input signal is judged to be lower; a filter circuit connected to the first and the second voltage detection circuits, to which the output signals from the first and the second voltage detection circuits are inputted while a second input signal is inputted, configured to output the output signals from the first and the second voltage detection circuits on the basis of the second input signal; and an operation mode entry setting circuit configured to judge plural times whether or not the output signals from the first and second voltage detection circuits outputted from the filter circuit coincide with predetermined levels in synchronization with an input clock signal, and make an enter of an operation mode if all of the judge-results show that the signals coincide with the predetermined levels.

According to a fourth aspect of the present invention, there is provided a semiconductor apparatus comprising a first voltage detection circuit to which a first input signal is inputted, configured to judge whether a potential of the input signal is higher or lower than a first reference potential, and output a first level signal if the potential of the input signal is judged to be higher; a second voltage detection circuit to which the first input signal is inputted, configured to judge whether the potential of the input signal is higher or lower than a second reference potential, and output a second level signal if the potential of the input signal is judged to be lower; a third voltage detection circuit to which a second input signal is inputted, configured to judge whether the potential of the input signal is higher or lower than the first reference potential, and output the first level signal if the potential of the input signal is judged to be higher; a fourth voltage detection circuit to which the second input signal is inputted, configured to judge whether the potential of the input signal is higher or lower than the second reference potential, and output the second level signal if the potential of the input signal is judged to be lower; a first filter circuit connected to the first and the second voltage detection circuits, to which a output signals from the first and the second voltage detection circuits are inputted while a third input signal is inputted, configured to output the output signals from the first and the second voltage detection circuits on the basis of the third input signal; a second filter circuit connected to the third and the fourth voltage detection circuits, to which a output signals from the third and the fourth voltage detection circuits are inputted while the third input signal is inputted, configured to output the output signals from the third and the fourth voltage detection circuits on the basis of the third input signal; and an operation mode entry setting circuit configured to judge plural times whether or not the output signals from the first to fourth voltage detection circuits outputted from the first and the second filter circuits coincide with predetermined levels in synchronization with an input clock signal, and make an enter of an operation mode if all of the judged-results show that the signals coincide with the predetermined levels.

According to a fifth aspect of the present invention, there is provided a semiconductor apparatus comprising a first voltage detection circuit to which a first input signal is inputted, configured to judge whether a potential of the input signal is higher or lower than a first reference potential, and output a first level signal if the potential of the input signal is judged to be higher; a second voltage detection circuit to which the first input signal is inputted, configured to judge whether the potential of the input signal is higher or lower than a second reference potential, and output a second level signal if the potential of the input signal is judged to be lower; a filter circuit connected to the first and the second voltage detection circuits, to which the output signals from the first and the second voltage detection circuits are inputted while the second input signal is inputted, configured to output the output signals from the first and the second voltage detection circuits on the basis of the second input signal; and an operation mode entry setting circuit configured to make an enter of an operation mode on the basis of the output signal from the filter circuits.

According to a sixth aspect of the present invention, there is provided a semiconductor apparatus comprising a first voltage detection circuit to which a first input signal is inputted, configured to judge whether a potential of the input signal is higher or lower than a first reference potential, and output a first level signal if the potential of the input signal is judged to be higher; a second voltage detection circuit to which the first input signal is inputted, configured to judge whether the potential of the input signal is higher or lower than a second reference potential, and output the second level signal if the potential of the input signal is judged to be lower; a third voltage detection circuit to which a second input signal is inputted, configured to judge whether the potential of the input signal is higher or lower than the first reference potential, and output the first level signal if the potential of the input signal is judged to be higher; a fourth voltage detection circuit to which the second input signal is inputted, configured to judge whether the potential of the input signal is higher or lower than the second reference potential, and output the second level signal if the potential of the input signal is judged to be lower; a first filter circuit connected to the first and the second voltage detection circuits, to which the output signals from the first and the second voltage detection circuits are inputted while a third input signal is inputted, configured to output the output signals from the first and the second voltage detection circuits on the basis of the third input signal; a second filter circuit connected to the third and the fourth voltage detection circuits, to which the output signals from the third and the fourth voltage detection circuits are inputted while the third input signal is inputted, configured to output the output signals from the third and the fourth voltage detection circuits on the basis of the third input signal; and an operation mode entry setting circuit configured to make an entry of a specific operation mode on the basis of the output signal from the first and the second filter circuits.

According to a seventh aspect of the present invention, there is provided a semiconductor apparatus comprising a voltage detection circuit to which an input signal is inputted, configured to judge whether a potential of the input signal is higher or lower than a predetermined reference potential, output a first level signal if the potential of the input signal is judged to be higher, and output a second level signal if the potential of the input signal is judged to be lower; and an operation mode entry setting circuit configured to judge plural times whether or not the output signal from the voltage detection circuit coincides with predetermined levels in synchronization with an input clock signal, and make an enter of an operation mode if all of the judged-results show that the signal coincides with the predetermined levels.

According to an eighth aspect of the present invention, there is provided a mode setting method for a semiconductor apparatus comprising judging plural times whether or not a relation in level between first and second reference potentials and an input signal potential coincides with a predetermined condition in synchronization with an input clock signal, and executing a mode entry operation if all of the judge-results show that the relation coincides with the predetermined condition; and selecting an operation mode on the basis of an mode selection signal after the mode entry operation.

BRIEF DESCRIPTION OF THE SEVERAL VIEWS OF THE DRAWING

FIG. 12 is a circuit diagram of the test mode entry setting circuit in the second embodiment of the present invention;

FIG. 16 is a structural diagram showing the voltage detection circuit unit and the decode circuit shown in FIG. 14 with a chip enable buffer, a test enable buffer, an address buffer, and a delay circuit 11;

FIG. 18 is a block diagram of an entire structure of a fourth embodiment of the present invention;

FIG. 19 is a circuit diagram of the voltage detection circuit unit in the fourth embodiment of the present invention;

FIG. 20 is a circuit diagram of the test enable buffer in the first to fourth embodiments of the present invention;

FIG. 25 is a block diagram of an entire structure of a sixth embodiment of the present invention;

FIG. 26 is a timing waveform diagram of main signals in the sixth embodiment of the present invention;

FIG. 27 is a block diagram of an entire structure of a seventh embodiment of the present invention;

FIG. 29 is a block diagram of an entire structure of an eighth embodiment of the present invention.

DETAILED DESCRIPTION OF THE INVENTION

Figure 1:
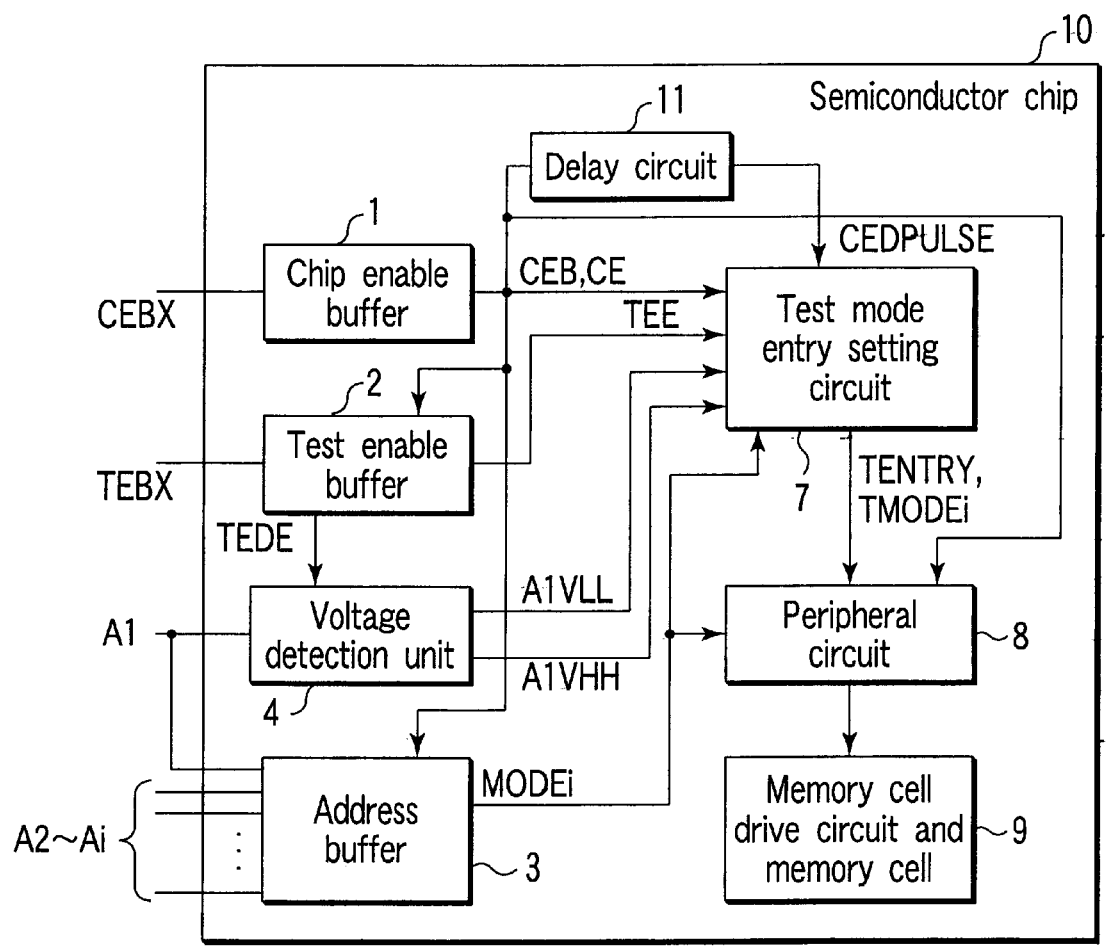
FIG. 1 is a block diagram of an entire structure of a first embodiment of the present invention.

Next, embodiments of the present invention will be explained with reference to the accompanying drawings. In the description of the figures below, parts being the same as or similar to each other have the same reference numeral or similar reference numerals.

(First Embodiment)

A semiconductor storage apparatus according to a first embodiment of the present invention will be explained with reference to FIG. 1.

In a structural diagram of this embodiment shown in FIG. 1, a semiconductor chip 10 comprises a chip enable buffer 1, a test enable buffer 2, an address buffer 3, a first voltage detection circuit unit 4, a test mode entry setting circuit 7, a peripheral circuit 8, a memory cell drive circuit and memory cell 9, and a delay circuit 11. The memory cell may be composed of a semiconductor memory, and for example, a ferroelectric memory or a flash memory can be applied.

In this embodiment, an address signal A1 is inputted to the voltage detection circuit unit 4 to which a specific address is inputted.

Output signals A1VLL and A1VHH are outputted from the voltage detection circuit unit 4 to which the address signal A1 is inputted, and the signals are directly inputted to the test mode entry setting circuit 7. Chip enable signals CE and CEB, a test enable pulse signal TEE, and a chip enable delay pulse signal CEDPULSE are inputted to, and a test entry signal TENTRY and a test mode signal TMODEi are outputted from the test mode entry setting circuit 7.

Figure 2:
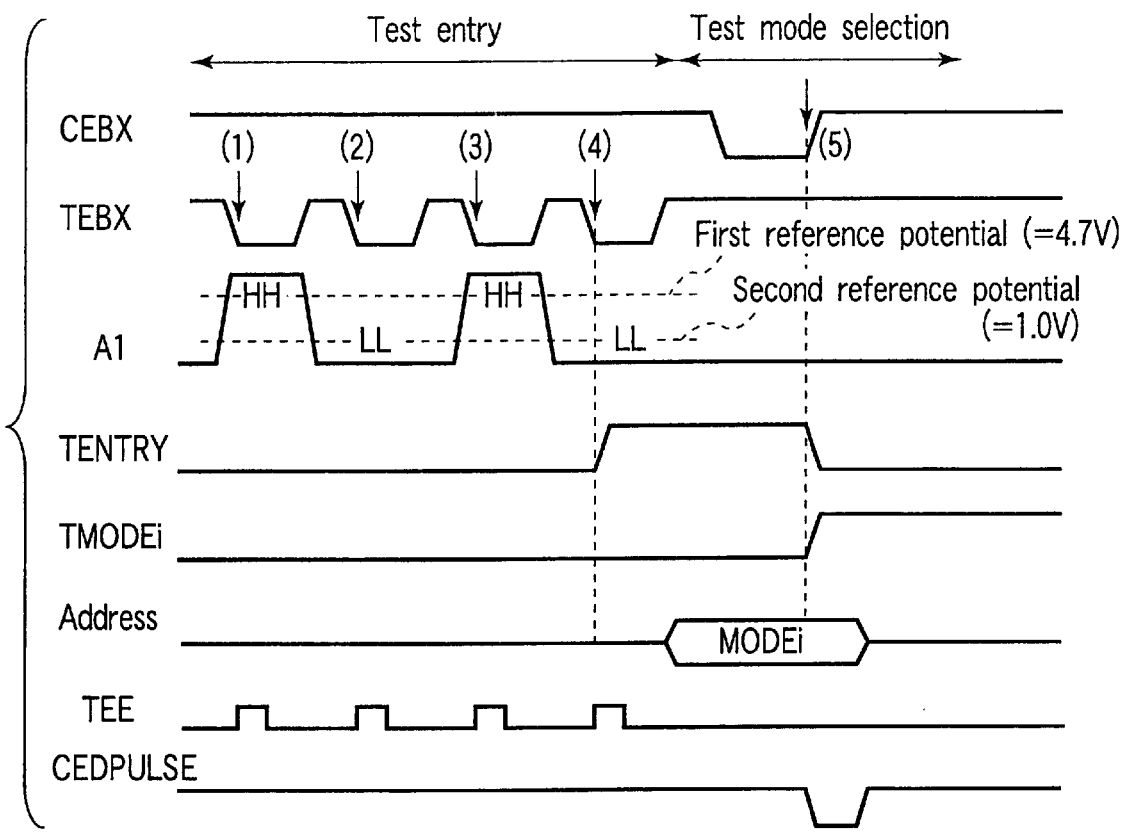
FIG. 2 is a timing waveform diagram of main signals in the first embodiment of the present invention.

As shown in FIG. 2, in which timing waveforms of main signals in this embodiment are shown, concerning a pulse signal of the test enable signal TEBX, an input signal of the address signal A1 is HH at the first pulse, the input signal of the address signal A1 is LL at the second pulse, the input signal of the address signal A1 is HH at the third pulse, and the input signal of the address signal A1 is LL at the fourth pulse. Here, it is assumed that reference numeral LL indicates a voltage being lower than a first reference voltage and reference numeral HH indicates a voltage being higher than a second reference voltage.

In this embodiment, as shown in FIG. 2, concerning the output signal TENTRY from the test mode entry setting circuit 7, only when the address signal A1 is inputted to a sequence of the pulse of the test enable signal TEBX in order, that is, "HH, LL, HH, and LL", test entry is established and the output signal TENTRY changes to an "H" level.

An external signal CEBX is inputted to, and the chip enable signals CEB and CE are outputted from the chip enable buffer 1. While being active, the chip enable signal CEB is at an "L" level, and the chip enable signal CE is at the "H" level. On the other hand, while standing by, the chip enable signal CEB is at the "H" level, and the chip enable signal CE is at the "L" level. The chip enable signals CEB and CE are inputted to the test entry buffer 2, the address buffer 3, the voltage detection circuit unit 4, the test mode entry setting circuit 7, and the peripheral circuit 8.

The test enable buffer 2 is a buffer circuit exclusively for testing, and the chip enable signal CEB and the test enable signal TEBX being an external signal are inputted to and the test enable signal TEE and a level detection enable signal TEDE are outputted from the buffer. The test enable buffer 2 is activated during standby, and when the external signal TEBX changes from the "H" level to the "L" level, the test enable signal TEE is outputted as an "H" pulse signal for a fixed term while the level detection enable signal TEDE is outputted as a pulse signal at the "L" level for the same fixed term. The test enable signal TEE is fixed at the "L" level during activities while the level detection enable signal TEDE is fixed at the "H" level. The test enable signal TEE is inputted to the test mode entry setting circuit 7 while the level detection enable signal TEDE is inputted to the voltage detection circuit unit 4.

External signals (address signals) A2 to Ai (i is a natural number) are inputted to the address buffer 3, and the output signal therefrom is inputted to the test mode entry setting circuit 7 and the peripheral circuit 8.

The address signal inputted to the peripheral circuit 8 is outputted via a decode circuit (not shown) and is inputted to the memory cell drive circuit and memory cell 9, and the memory cell specified by the address signal is selected.

The external signal A1 is inputted to and the output signals A1VLL and A1VHH are outputted from the voltage detection circuit unit 4, and the output signals are inputted to the test mode entry setting circuit 7.

The chip enable delay pulse signal CEDPULSE being a delay signal resulting from delaying the chip enable signal CEB at the delay circuit 11 is inputted to the test mode entry setting circuit 7. The test entry signal TENTRY and the test signal TMODEi are outputted from the test mode entry setting circuit 7 on the basis of the input signal, and the signals are inputted to the peripheral circuit 8.

FIG. 2 shows timing waveforms of main signals shown in FIG. 1 concerning the test mode entry operation. The operation shown here is not a timing waveform of normal read-out operation or write-in operation, but the timing waveform of the operation of the test mode setting.

First, under a test entry state, the test entry signal TENTRY being a signal at a test mode setting preparation stage changes from an "L" level to an "H" level on the basis of the external signal (indicated as A1 here) and the test enable signal TEBX being a clock signal. Then, at a timing at which the chip enable signal CEBX changes from the "L" level to the "H" level, the test mode signal TMODEi changes from the "L" level to the "H" level so that the test mode is set.

The chip enable signal CEBX, the test enable signal TEBX, and the address signals (indicated as A1 to Ai here) are external input signals, and the test entry signal TENTRY, the test mode signal TMODEi, the chip enable delay pulse signal CEDPULSE, and the test enable pulse signal TEE are internal signals generated inside the chip.

Moreover, although the address signal A1 functions as an address for selecting the memory cell during the read-out/write-in operation of normal operation of the semiconductor storage apparatus, it is inputted to the voltage detection circuit unit 4 as an entry signal when the test mode is enter.

The test entry signal TENTRY changes from the "L" level to the "H" level when the test entry is established, and changes to the "L" level at a timing at which the test mode signal TMODEi changes to the "H" level. After the test entry, an optional test mode signal TMODEi is selected by using the address signal MODEi, which is a combination of the address signals A1 to Ai. The test mode signals TMODEi are assigned to the combination of plural addresses designating the predetermined test mode and are selected at a timing at which the chip enable signal CEBX changes from the "L" level to the "H" level after the test entry, and they transit from the "L" level to the "H" level.

Next, an explanation will be given of the test entry operation with reference to FIG. 2. The test entry is executed by setting the address signal A1 at an "HH" level or at an "LL" level while the test enable signal TEBX is clock-operated with the chip enable signal CEBX at the "H" level and with the semiconductor storage apparatus standing-by.

The structure and the operation of the test enable buffer 2 will be explained by using FIG. 20. The test enable buffer 2 comprises a PMOS transistor M1701 in which a ground potential is inputted to a gate, an inverter composed of NMOS transistors M1702, M1703 and M1704, an inverter INV1710 whose input signal is the output from the inverter, an inverter INV1711 to which an output signal TEB from the inverter INV1710 is inputted, a NAND circuit NAND1711 to which the output signal from the inverter INV1711 and the chip enable signal CEB are inputted, an inverter INV1712 to which the output signal from the NAND circuit NAND1711 is inputted, a NAND circuit NAND1712 to which the output signal from the inverter INV1712 and the output signal from the delay circuit 39 to which the output from the inverter INV1713 for reversing the output signal from the inverter INV1712 are inputted, an inverter INV1714 in which the output signal of the NAND circuit NAND1712 is inputted to and the test enable signal TEE being the input signal of filter circuits 31 and 32 (refer to FIG. 14) is outputted from, and an inverter INV1715 in which the test enable signal TEE is inputted to and the level detection enable signal TEDE is outputted from.

The operation of the test enable pulse buffer 2 will be explained below.

During the standby, the chip enable signal CEB is at the "H" level, and the output signal from the NAND circuit NAND1711, to which a reversal signal of the test enable signal TEBX and the chip enable signal CEB are inputted, corresponds to the test enable signal TEBX.

When the external test enable signal TEBX falls, the output signal TEB from the inverter INV1710 falls from the "H" level to the "L" level, and the output signal from the NAND circuit NAND1711 also changes from the "H" level to the "L" level. The output signal from the inverter INV1712 changes from the "L" level to the "H" level, and the signal passing the inverter INV1713 and the delay circuit 39 after the inverter changes from the "H" level to the "L" level being later than the signal from the inverter INV1712 by the time of delay at the delay circuit 39.

Only during a term since the output signal from the inverter INV1712 changes to the "H" level until the output signal from the delay circuit 39 is delayed to be at the "L" level, the output signal from the NAND circuit NAND1712, to which the output signals from the inverter INV1712 and the delay circuit 39 are inputted, is at the "L" level, and moreover, the output signal TEE (test enable pulse signal) of the inverter INV1714 is at the "H" level. That is, the output signal TEE changes from the "L" level to the "H" level when the test enable signal TEBX falls from the "H" level to the "L" level, and after the time set at the delay circuit 39 passes, it becomes a pulse signal that changes to the "L" level.

The level detection enable signal TEDE being the output signal of the inverter INV1715 changes from the "H" level to the "L" level, and after the time set at the delay circuit 39 passes, it becomes a pulse signal that changes to the "H" level.

During the activities, the chip enable signal CEB is at the "L" level, the output signal from the NAND circuit NAND1711 is fixed at the "H" level, the output signal does not transit even if the test enable signal TEBX changes, the test enable signal TEE is fixed at the "L" level, and the level detection enable signal TEDE is fixed at the "H" level.

In FIG. 1, level setting of the address signal A1 is executed by setting a first reference potential and a second reference potential at the voltage detection circuit unit 4, and by detecting whether the address signal A1 is higher or lower than the reference potentials. In this embodiment, the semiconductor storage apparatus with a source voltage of 3.3V is used as an example, and the first reference potential is set to 4.7V, and the second reference potential is set to 1.0V.

In FIG. 2, it is assumed that reference numeral LL indicates a voltage being lower than the second reference voltage, and reference numeral HH indicates a voltage being higher than the first reference voltage. As shown in FIG. 2, the test enable signal TEBX of a sequential pulse of four steps 1 to 4 is applied at a time of the test entry. The address signal A1 is set to HH when the pulse falls for the first time, the address signal A1 is set to LL when the pulse falls for the second time, the address signal A1 is set to HH when the pulse falls for the third time, and the address signal A1 is set to LL when the pulse falls for the fourth time. The test entry is established by, when the output signal of the test enable buffer 2 and the level detection enable signal TEDE are at the "L" level, activating the first voltage detection circuit unit 4, and inputting the entry signal corresponding to the input signal Ai to the test entry setting circuit 7. A pulse width of the test enable signal TEE is, for example, about 20 ns.

When the test enable signal TEBX of the sequential pulse of the four steps is inputted, the test entry signal TENTRY changes to the "H" level at the timing of the fourth pulse of the test enable signal TEBX so that the test entry is established. After the test entry is established, the test mode is selected by the pulse of the chip enable signal CEBX that is change from the "H" level to the "L" level, and then to the "H" level. The test mode entry setting circuit 7 takes in the address combination MODEi at the pulse of the chip enable signal CEBX, and selects a specific mode from plural test modes TMODEi corresponding to the address combination.

When the chip enable signal CEBX changes from the "L" level to the "H" level, the test mode signal TMODEi changes to the "H" level while the chip enable delay pulse signal CEDPULSE changes from the "H" level to the "L" level, and the test entry signal TENTRY changes to the "L" level all at the same timing.

As mentioned above, the test mode setting operation is to execute the test entry first, and then select the test mode after the test entry is established. That is, the test entry operation is set by the level setting of the address signal A1 and the sequence of the pulses of the test enable signal TEBX.

The test mode selection operation is executed by the clock operation of the chip enable signal CEBX and the setting of the address signals A1 to Ai.

With a combination of the test entry operation and the test mode selection operation, the operation of the test mode entry is completed. An optional test mode setting can be executed in this manner. That is, plural sorts of test modes are previously prepared according to the setting of the address signal, the optional test operation becomes possible by using the combination of the designated address signals. Moreover, concerning the test entry operation, the combination of the potential levels of the address signal A1 is not limited to the combination shown in FIG. 2, and other optional combinations of the potential levels may be used.

Moreover, concerning cancellation of the test operation, switching from the test mode to the normal operation becomes possible by assigning a mode of test cancellation to the selection of the test mode, and by selecting the test cancellation after the test entry operation in a similar manner to the test mode setting. Such a test entry method can realize a test circuit with a high variance by using a structure with one entry circuit and plural selection circuits such as the selection of the test mode, the combination of plural test modes, and the cancellation of the test mode.

Figure 3:
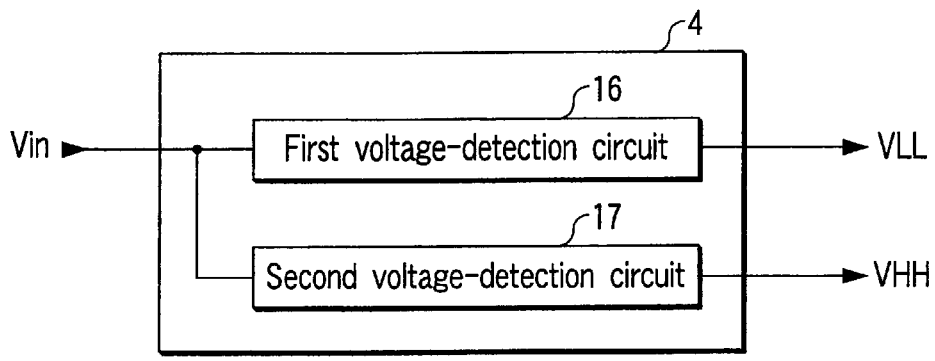
FIG. 3 is a conceptual diagram of a voltage detection circuit unit in the first embodiment of the present invention.

Next, the voltage detection circuit unit 4 will be described. A conceptual diagram of the voltage detection circuit unit 4 is as shown in FIG. 3. In FIG. 3, the input signal is indicated as Vin (it corresponds to A1 in FIG. 1), and the output signals are indicated as VLL (it corresponds to the reference numeral A1VLL in FIG. 1) and VHH (it corresponds to the reference numeral A1VHH in FIG. 1). The input signal Vin is inputted to the first voltage detection circuit 16 and the second voltage detection circuit 17 respectively, and the output signal VLL is outputted from the first voltage detection circuit 16, and the output signal VHH is outputted from the second voltage detection circuit 17. The relation between the input signal Vin, and the output signals VLL and VHH is as shown in FIG. 4.

Figure 4:
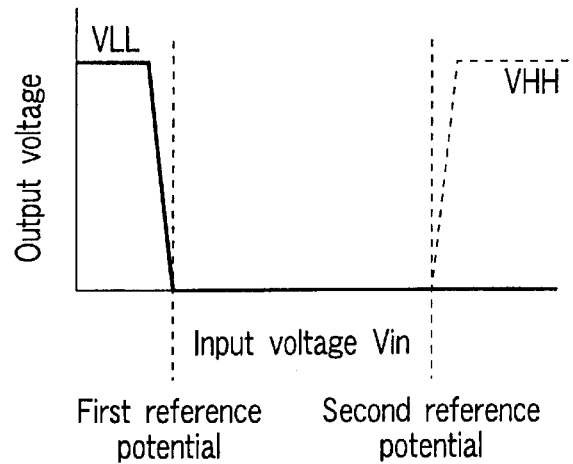
FIG. 4 is a drawing showing a relation between input/output voltages of the voltage detection circuit unit in the first embodiment of the present invention.

In FIG. 4, a horizontal axis indicates a voltage of the input signal Vin, and a vertical axis indicates voltages of the output signals VLL and VHH. When the voltage of the input signal Vin is lower than the first reference potential, the voltage of the output signal VLL changes to the "H" level, and when the voltage of the input signal Vin is the first reference potential or more, the voltage of the output signal VLL changes to the "L" level. When the voltage of the input signal Vin is lower than the second reference potential, the voltage of the output signal VHH changes to the "L" level, and when the voltage of the input signal Vin becomes higher and exceeds the second reference potential, the voltage of the output signal VHH changes to the "H" level.

By using the voltage detection circuit unit, there can be detected three voltage states, that are the states where, the voltage of the input signal Vin is below the first reference potential (the first state), the voltage is above the second reference voltage (the second state), and the voltage is between the first reference potential and the second reference potential (the third state).

Figure 5:
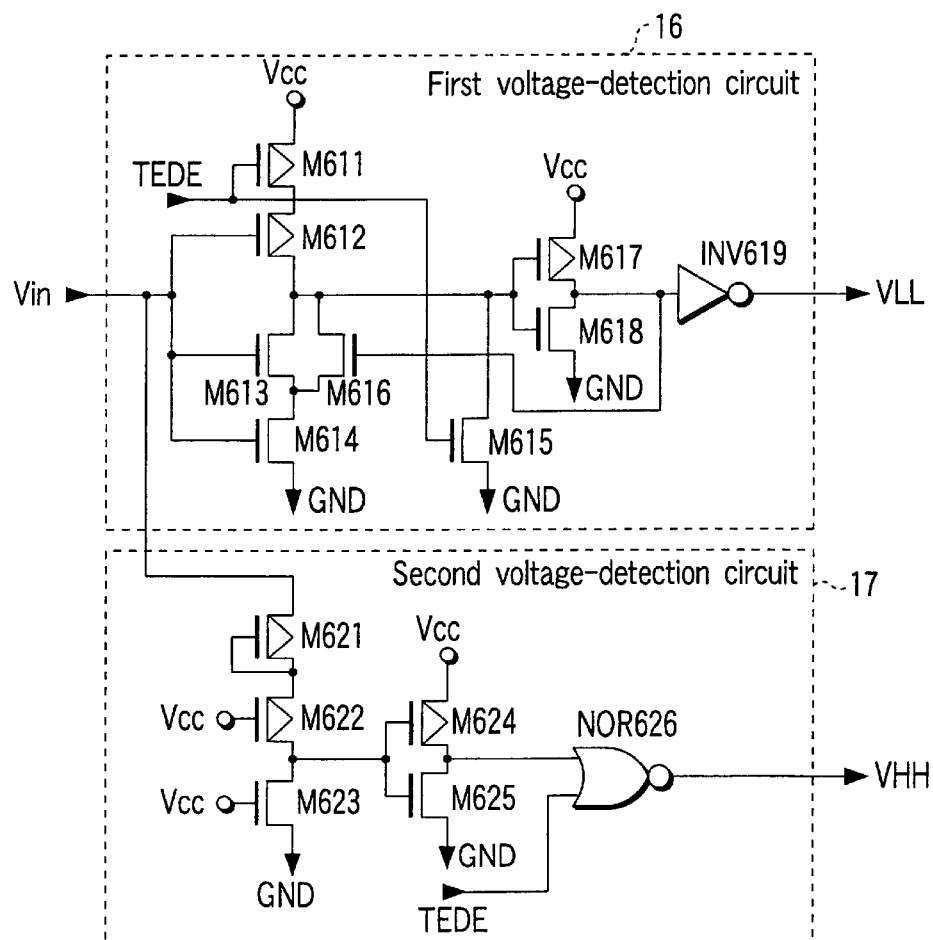
FIG. 5 is a circuit diagram of the voltage detection circuit unit in the first embodiment of the present invention.

Next, concrete circuits of the first voltage detection circuit 16 for detecting a low level and the second voltage detection circuit 17 for detecting a high level shown in FIG. 3 are shown in FIG. 5.

The first voltage detection circuit 16 is constituted by a NOR circuit composed of transistors M611 to M616, a first inverter composed of transistors M617 and M618, and a second inverter INV619.

The external input signal Vin and the level detection enable signal TEDE are inputted to the first voltage detection circuit 16. This level detection enable signal TEDE is the output signal of the test enable buffer 2 that is at the "H" level while the semiconductor storage apparatus is active, and changes to the "L" level pulse when the external signal TEBX falls during the standby.

While the semiconductor storage apparatus is active, the level detection enable signal TEDE is at the "H" level, the M611 of the NOR circuit composed of the transistors M611 to M616 is under the off-state, the M615 is under the on-state, the output from the NOR circuit is at the "L" level, the inverter outputs from the M617 and M618 are at the "H" level, and the output VLL from the inverter INV619 is at the "L" level.

During the standby, the level detection enable signal TEDE changes to the "L" level corresponding to the transition of the external signal TEBX, the transistor M611 is under the on-state, and the transistor M615 is under the off-state; and the voltage of the output signal VLL is determined in accordance with the input signal Vin. That is, when the voltage of the input signal Vin is lower, the output signal VLL is at the "H" level, and when the input signal Vin is higher, the output signal VLL is at the "L" level. A condition for the output signal VLL to transit from the "H" level to the "L" level is determined by a threshold of the NOR circuit composed of the M611 to M616, and it is set to be 1.0V here. Accordingly, the first reference potential is 1.0V.

The second voltage detection circuit 17 is constituted by a first stage circuit composed of transistors M621 to M623, an inverter composed of transistors M624 and M625, and a NOR circuit NOR626 to which the output form the inverter composed of the transistors M624 and M625 and the level detection enable signal TEDE being the output signal from the test enable buffer 2 are inputted.

Under the state where the semiconductor storage apparatus is active, the level detection enable signal TEDE is at the "H" level and the output signal VHH is at the "L" level.

Under the state where the semiconductor storage apparatus is standing by, the level detection enable signal TEDE changes to the "L" level in accordance with the transition of the external signal TEBX, and the output signal is determined by the input signal Vin.

Here, when the input signal Vin is Vcc+2×Vthp or more, the output signal VHH equals to the "H" . Here, reference numeral Vcc is an operation source voltage, and reference numeral Vthp is a threshold voltage of the PMOS transistor inside the second voltage detection circuit 17. The PMOS transistor M622 in which the voltage Vcc is inputted to the gate is turned on when the source voltage equals to Vcc+Vthp. Moreover, the PMOS transistor M621 in which the drain and the gate are connected to each other is turned on when the source voltage vin equals to 2×Vthp. Here, a drive capacity of an NMOS transistor M623 is set sufficiently weak.

Accordingly, when the input signal Vin is Vcc+2×Vthp or more, the input potential of the inverter composed of the transistors M624 and M625 changes to the "H" level, the output from the inverters M624 and M625 changes to the "L" level, and the output signal VHH from the NOR 626 changes to the "H" level. On the contrary, when the input signal Vin becomes under Vcc+2×Vthp, the output signal VHH changes to the "L" level. Here, the threshold voltage of the PMOS transistor is approximately 0.7V, and Vcc+2Vthp is set to 4.7V. Accordingly, the second reference potential is 4.7V.

By combining the first voltage detection circuit 16 and the second voltage detection circuit 17, when the input signal Vin is 1.0V or less, the VLL is at the "H" level and the VHH is at the "L" level, and when the input signal Vin is 4.7V or more, the VLL is at the "L" level and the VHH is at the "H" level. Moreover, when the input signal Vin is 1.0V or more and 4.7V or less, both the VLL and VHH are at the "L" level.

Figure 6:
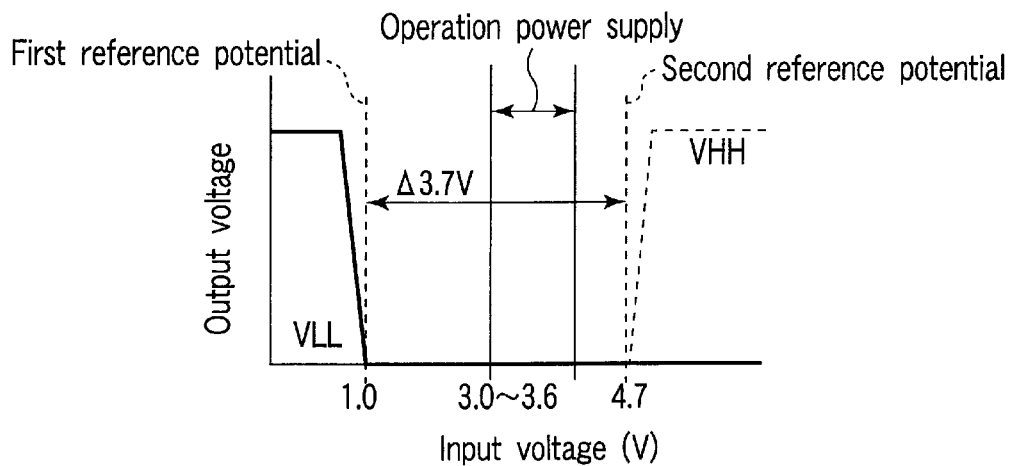
FIG. 6 is a drawing showing the relation between input/output voltages of the voltage detection circuit unit in the first embodiment of the present invention.

FIG. 6 shows the relation between the input signal and output signal of the voltage detection circuit unit. In this embodiment, an explanation is given of the semiconductor storage apparatus whose operation source voltage is between 3.0V to 3.6V, and whose input voltage of the normal operation is between 0V to 3.6V as an example.

As shown in FIG. 6, when the input signal Vin is 1.0V or less, the output signal VLL is at the "H" level, and when the input signal Vin is 4.7V or more, the output signal VHH is at the "H" level. In this manner, an area in which the input signal Vin is 1.0V or more and 4.7V or less is an area in which the output signals VLL and VHH are both at the "L" so that the area works as a dead zone to the input voltage.

Figure 7:
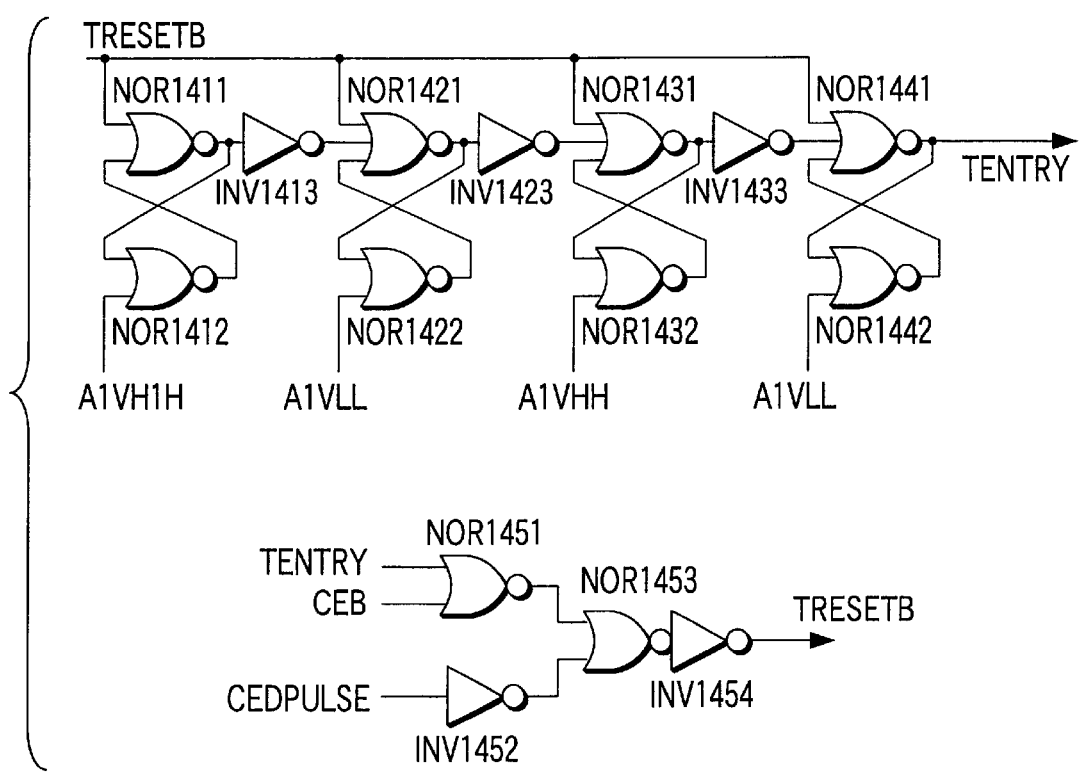
FIG. 7 is a circuit diagram of a test mode entry setting circuit in the first embodiment of the present invention.

FIG. 7 shows a concrete structure example of the test mode entry setting circuit 7 in this embodiment. Here, the address signal A1 is inputted in order, that is "HH, LL, HH, and LL", and when the test entry mode is established, the test entry signal TENTRY changes to the "H" level.

The test mode entry setting circuit 7 has the first to fourth latch circuits connected to each other in serial, and outputs the test entry signal TENTRY. The first latch circuit is constituted by NOR circuits NOR1411 and NOR1412 whose input and output are connected to each other, and an inverter INV1413. The second latch circuit is constituted by NOR circuits NOR1421 and NOR1422 whose input and output are connected to each other, and an inverter INV1423. The third latch circuit is constituted by NOR circuits NOR1431 and NOR1432 whose input and output are connected to each other, and an inverter INV1433. The fourth latch circuit is constituted by NOR circuits NOR1441 and NOR1442 whose input and output are connected to each other.

Moreover, the test mode entry setting circuit 7 has a NOR circuit NOR1451 to which the test entry signal TENTRY and the chip enable signal CEB are inputted, an inverter INV1452 to which the chip enable delay pulse signal CEDPLUSE is inputted, a NOR circuit NOR1453 to which the output from the inverter INV1452 and the output from the NOR circuit NOR1451 are inputted, and an inverter INV1454 to which the output from the NOR circuit NOR1453 is inputted and from which a test reset signal TRESETB is outputted.

The test reset signal TRESETB is inputted to the NOR circuits NOR1411, NOR1421, NOR1431, and NOR1411 in the first to fourth latch circuits. Moreover, to the NOR circuits NOR1412, NOR1422, NOR1432, and NOR 1442 in the first to fourth latch circuits, the output signals A1VHH, A1VLL, A1VHH, and A1VLL from the first voltage detection circuit unit 4 are inputted respectively.

Here, en explanation will be given of the test mode entry setting operation.

Before the state becomes the test entry state, when the reset signal TRESETB becomes the pulse that changes from the "L" level to the "H" level and than to the "L" level, the NOR circuit in the latch circuits of four stages inside the test mode entry setting circuit 7 are reset, and the outputs from the inverters INV1413, INV1433, and INV1433 changes to the "H" level and the test entry signal TENTRY changes to the "L" level.

When the state becomes the test entry state, as shown in FIG. 2, the address signal A1 changes to the "HH" state at first, and the output signal A1VHH from the first voltage detection circuit unit 4 that is inputted to the NOR circuits NOR1412 and NOR1432 changes to the "H" level. Here, the latch circuit at the third stage is reset by the output from the inverter INV1423, and the output from the inverter INV1433 does not change. Only the output from the inverter INV1413 being the output from the latch circuit at the first stage changes from the "H" level to the "L" level.

Next, the address signal A1 changes to the "LL" state, and the output signal A1VLL from the first voltage detection circuit unit 4 that is inputted to the NOR circuits NOR1422 and NOR1442 changes to the "H" level. Under the state, the latch circuit at the fourth stage is reset by the output from the inverter INV1433, and the test entry signal TENTRY is left fixed at the "L" level. Only the output from the inverter INV1423 being the output from the latch circuit at the second stage changes from the "H" level to the "L" level.

At the next third pulse, the output from the inverter INV1433 changes from the "H" level to the "L" level.

At the next fourth pulse, the test entry signal TENTRY being the output from the latch circuit at the fourth stage changes from the "L" level to the "H" level.

Here, in a logic circuit comprising the NOR circuit NOR1451, the inverter INV1452, the NOR circuit 1453, and the inverter INV1454, when the test mode is selected at the pulse of the chip enable signal CEB after the test entry signal changes to the "H" level, the chip enable signal CEB changes from the "H" to the "L", and then, at the timing at which the chip enable signal CEB rises from the "L" level to the "H" level and the chip enable delay pulse signal CEDPULSE changes from the "H" to the "L", the pulse of the reset signal TRESETB rises from the "L" level to the "H" level. By the pulse of the reset signal TRESETB, the test entry signal TENTRY is reset from the "H" level to the "L" level while the first to fourth latch circuits are also reset at the same time.

Here, when the state is not the test mode but the normal operation, the reset signal TRESETB is at the "H" level and the test mode entry setting circuit 7 is reset, even when the test entry signal TENTRY is at the "L" level and the chip enable signal CEB is also at the "L" level,.

The test mode entry setting circuit 7 is a circuit for judging whether or not the address signal A1 is inputted in order of "HH, LL, HH, and LL" at the respective timings of transition from the "H" level to the "L" level of the four pulses of the test enable signal TEBX level by receiving the output signal from the first voltage detection circuit unit 4, and when the input in the order is correctly executed, the test entry signal TENTRY changes to the "HH" level.

Figure 8:
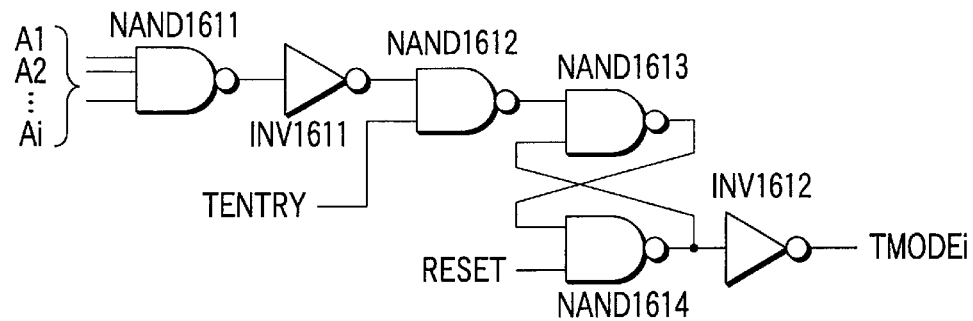
FIG. 8 is a circuit diagram of a test mode signal generation circuit in the first embodiment of the present invention.

FIG. 8 shows a circuit structure of the test mode signal generation circuit inside a test mode entry setting circuit 7.

The test mode signal generation circuit comprises a NAND circuit NAND1611 to which the address signals A1, A2, and Ai (i is a natural number) are inputted, an inverter INV1611 to which the output from the NAND circuit NAND1611 is inputted, a NAND circuit NAND1612 to which the output from the inverter INV1611 and the test entry signal TENTRY are inputted, a latch circuit composed of the NAND circuits NAND1613 and NAND1614 whose input is the output from the NAND circuit NAND1612 and whose reset signal is the reset signal RESET, and an inverter INV1612 for reversing the output from the NAND circuit NAND1614 and for outputting a test selection signal.

The reset signal RESET is a reset pulse signal that changes from the "H" level to the "L" level and then to the "H" level during power charge and during test mode completion.

There may be provided a plurality of the test mode signal generation circuits whose number equals to the number of the test modes, and the address signal for decoding is determined in accordance with the number.

An explanation will be given of the operation of the test mode signal generation circuit.

Before the test entry, the address signals A1 to Ai are at the "L" level, the test entry signal TENTRY is at the "L" level, the reset signal RESET is at the "H" level, and the test mode signal TMODEi is at the "L" level.

After the test entry, when all the addresses corresponding to the selected test modes are at the "H" level under the state where the test entry signal TENTRY is at the "H" level, the output from the NAND circuit NAND1611 changes from the "H" level to the "L" level, the output from the inverter INV1611 changes from the "L" level to the "H" level, the output from the NAND circuit NAND1612 changes from the "H" level to the "L" level, and the latch circuit is set. Then, the output from the NAND circuit NAND1614 changes from the "H" level to the "L" level, the test mode signal TMODEi being the output from the inverter INV1612 changes from the "L" level to the "H" level, and the test mode corresponding to the address is selected.

At the same time as the test mode selection, the chip enable signal CEBX becomes a pulse waveform, and at the timing of the rise from the "L" level to the "H" level, the chip enable delay pulse signal CEDPULSE changes from the "H" level to the "L" level, the output from the inverter INV1452 shown in FIG. 7 changes from the "L" level to the "H" level, the NOR circuit NOR1453 changes from the "H" level to the "L" level, and the reset signal TRESET being the output from the inverter INV1454 further changes from the "L" level to the "H" level.

Then, the latch circuits of four stages composed of the NOR circuits NOR1411 to NOR1441 and the inverters INV1413 to INV1433 are reset. Moreover, the test entry signal TENTRY being the output from each of the latch circuits changes from the "H" level to the L level.

Moreover, the chip enable signal CEB is at the "L" level during activities, and under the states besides the test entry state, the output signal from the NOR circuit NOR1451 is at the "H" level, and the output signal from the NOR circuit NOR1453 is at the "H" level. As a result, the output signal TRESTB from the inverter INV1454 being the reset signal changes to the "H" level, all of the latch circuits of the test entry mode setting circuit 7 are reset, and the entry operation cannot be executed.

In this embodiment, when it is attempted to set the semiconductor storage apparatus to the test mode, it is necessary to input the pulse of the test enable signal TEBX for executing the test entry, and to set a specific address according to the pulse signal, which is the address A1 here, to the potential of 1.0V or less or the potential above 4.7V in a predetermined sequence.

In this manner, a false operation that unintentionally switches the mode to the test mode can be prevented by, concerning an input potential of at a high voltage side, setting the potential being higher than that of the source voltage of the normal operation as the reference potential, and by repeatedly executing a comparison test between the input potential and the reference potential more than once.

Here, a wide dead band in which the voltage is not detected by a low-level detection circuit or a highlevel detection circuit is 3.7V which is a gap between the reference potential 4.7V at the high potential side and the reference potential 1.0V at the low potential side. With such a sufficiently wide dead band and the voltage setting at the high voltage side, there is no case where the mode is falsely set to the test mode even if the input signal fractures by 1V to 2V due to an external factor of the semiconductor storage apparatus.

That is, the mode is not set to the test mode unless the "L" level is set to below 1.0V and the "H" level is set above 4.7V so that a risk of the false operation becomes extremely low, and distortion of the memory cell data due to testing caused by the false operation can surely be prevented.

Moreover, mode specification based on the address signal or level detection operation of the input signal is executed in synchronization with the clock signal so that the test mode can be set with assured high-speed clock operation.

In this manner, this embodiment enables the normal operation to be stable and realizes a semiconductor storage apparatus with high reliability.

The voltage detection circuit unit 4 in this embodiment sets a level judgment potential of the input signal with a circuit threshold and the threshold Vth of the transistor so that an increase of a circuit area is suppressed. Here, if the voltage at the "H" level side is set too high in order to give a safety for preventing a false setting to the test mode, there is a possibility that the transistor of the semiconductor apparatus is destroyed due to an allowable giving voltage, transistor proof pressure, and the like.

However, this embodiment has a circuit structure in which, by using the voltage detection circuit unit as shown in FIG. 5, the voltage can easily be set by adding the threshold Vth by one or two steps to a certain reference potential (it is indicated as the reference numeral Vcc in this embodiment), and the potential can easily be set in accordance with characteristics of the device. That is, by providing the transistor M622 in serial with the transistor M621 to which the input signal Vin in the high-level detection circuits 17 and 19 in the voltage detection circuit unit shown in FIG. 5 is inputted, the reference potential at the "H" level is set to the reference potential Vcc by adding the threshold by two steps.

In this manner, according to this embodiment, there can be provided the semiconductor storage apparatus that can prevent the mode from being falsely set to the test mode during the normal operation of the semiconductor storage apparatus, and can set the mode to the test mode with the test mode entry setting circuit having a relatively small area and with a relatively small number of commands.

Moreover, in this embodiment, it is not necessary to raise the potential of the signal at the "H" level up to near the proof pressure of the transistor while preventing the mode from being falsely set to the test mode. Owing to this, the distortion of the semiconductor storage apparatus during the test mode setting can surely be prevented as well.

Moreover, the potential is below the voltage that is normally used and above the ground potential in this embodiment unlike in the conventional technique in which a low-potential input is a negative power supply, so that it is not necessary to prepare the negative power supply for testing, and the test operation can efficiently be executed.

Moreover, a number of address signal lines used for the test mode setting is about one, which is small, in this embodiment, and the entry can be executed with a few steps and a penalty of a chip area is extremely small.

Moreover, in the test mode setting in this embodiment, among the addresses A1 to Ai, the TMODEi for specifying the sort of the test is outputted from the test mode entry setting circuit by the MODEi so that it is not necessary to provide the level detection circuit or the test mode entry setting circuit for each sort of the test. owing to this, there is provided the semiconductor storage apparatus with the low risk of the false operation that can set many sorts of test modes being highly integrated.

(Second Embodiment)

An explanation will be given of a semiconductor storage apparatus according to a second embodiment of the present invention with reference to FIG. 9.

Figure 9:
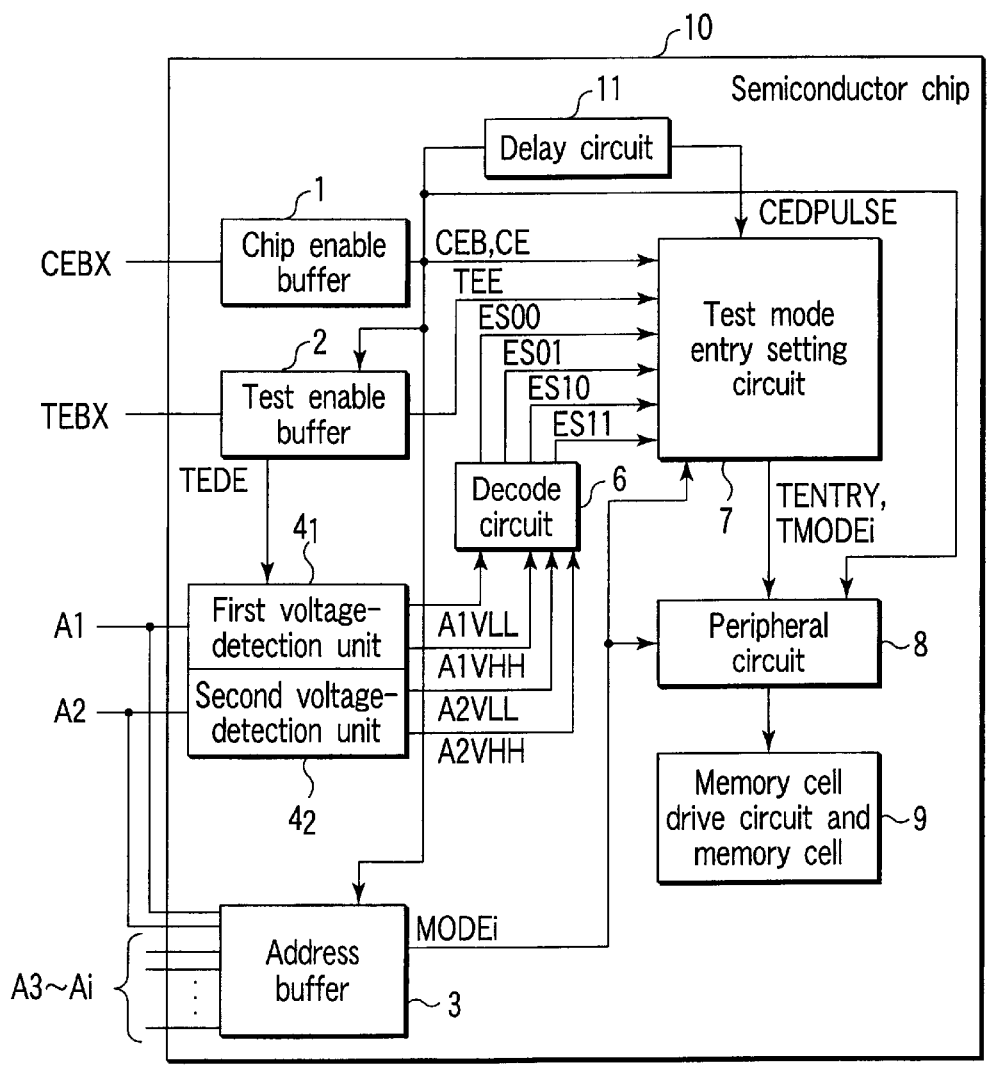
FIG. 9 is a block diagram of an entire structure of a second embodiment of the invention of the present invention.

In a structural diagram of this embodiment shown in FIG. 9, the semiconductor storage apparatus comprises a semiconductor chip enable buffer 1, a test enable buffer 2, an address buffer 3, a first voltage detection circuit unit $4_1$, a second voltage detection circuit unit $4_2$, decode circuit 6, a test mode entry setting circuit 7, a peripheral circuit 8, a memory cell drive circuit and memory cell 9, and a delay circuit 11. The memory cell may be composed of a semiconductor memory, and for example, a ferroelectric memory or a flash memory can be applied.

Here, there is shown a structure in which any one of address signals A1 and A2 is respectively inputted to the two voltage detection circuit units $4_1$ and $4_2$ to which a specific address is inputted.

An external signal CEBX is inputted to, and the chip enable signals CEB and CE are outputted from the chip enable buffer 1. While being active, the chip enable signal CEB is at an "L" level, and the chip enable signal CE is at the "H" level. Moreover, while standing by, the chip enable signal CEB is at the "H" level, and the chip enable signal CE is at the "L" level. The chip enable signals CEB and CE are inputted to the test entry buffer 2, the address buffer 3, the first voltage detection circuit unit 41 the second voltage detection circuit unit 42 the test mode entry setting circuit 7, and the peripheral circuit 8.

The test enable buffer 2 is a buffer circuit exclusively for testing, and the chip enable signal CEB and the test enable signal TEBX being an external signal are inputted to and the test enable signal TEE and a level detection enable signal TEDE are outputted from the buffer. The test enable buffer 2 is activated during standby, and when the external signal TEBX changes from the "H" level to the "L" level, the test enable signal TEE is outputted as an "H" pulse signal for a fixed term while the level detection enable signal TEDE is further outputted as a pulse signal at the "L" level for a similar term.

The test enable signal TEE is fixed at the "L" level during activities while the level detection enable signal TEDE is fixed at the "H" level. The test enable signal TEE is inputted to the test mode entry setting circuit 7 while the level detection enable signal TEDE is inputted to the first voltage detection circuit unit $4_1$ and the second voltage detection circuit unit $4_2$.

The external signals A1 to Ai (i is a natural number) are inputted to the address buffer 3, and the output signal therefrom is inputted to the test mode entry setting circuit 7 and the peripheral circuit 8.

The address signal inputted to the peripheral circuit 8 is outputted via the decode circuit (not shown) and is inputted to the memory cell drive circuit and memory cell 9, and the memory cell specified by the address signal is selected.

There are two voltage detection circuit units comprised here, and the external signal A1 is inputted to and the output signals A1VLL and A1VHH are outputted from the first voltage detection circuit unit $4_1$. The external signal A2 is inputted to and the output signals A2VLL and A2VHH are outputted from the second voltage detection circuit unit $4_2$. The output signals A1VLLA1VLL, A2VHH, and A2VLL from these two voltage detection circuit units $4_1$ and $4_2$ are inputted to the decode circuit 6. The output signals ES00, ES01, ES10, and ES11 are outputted from the decode circuit 6, and are inputted to the test mode entry setting circuit 7.

The chip enable delay pulse signal CEDPULSE being a delay signal of the chip enable signal CEB is inputted to the test mode entry setting circuit 7. The test entry signal TENTRY and the test signal TMODEi are outputted from the test mode entry setting circuit 7 on the basis of the input signal, and the signals are inputted to the peripheral circuit 8.

In this embodiment, there is used the test enable buffer 2 shown in FIG. 20 having a similar structure and function to those in the first embodiment.

Figure 10:
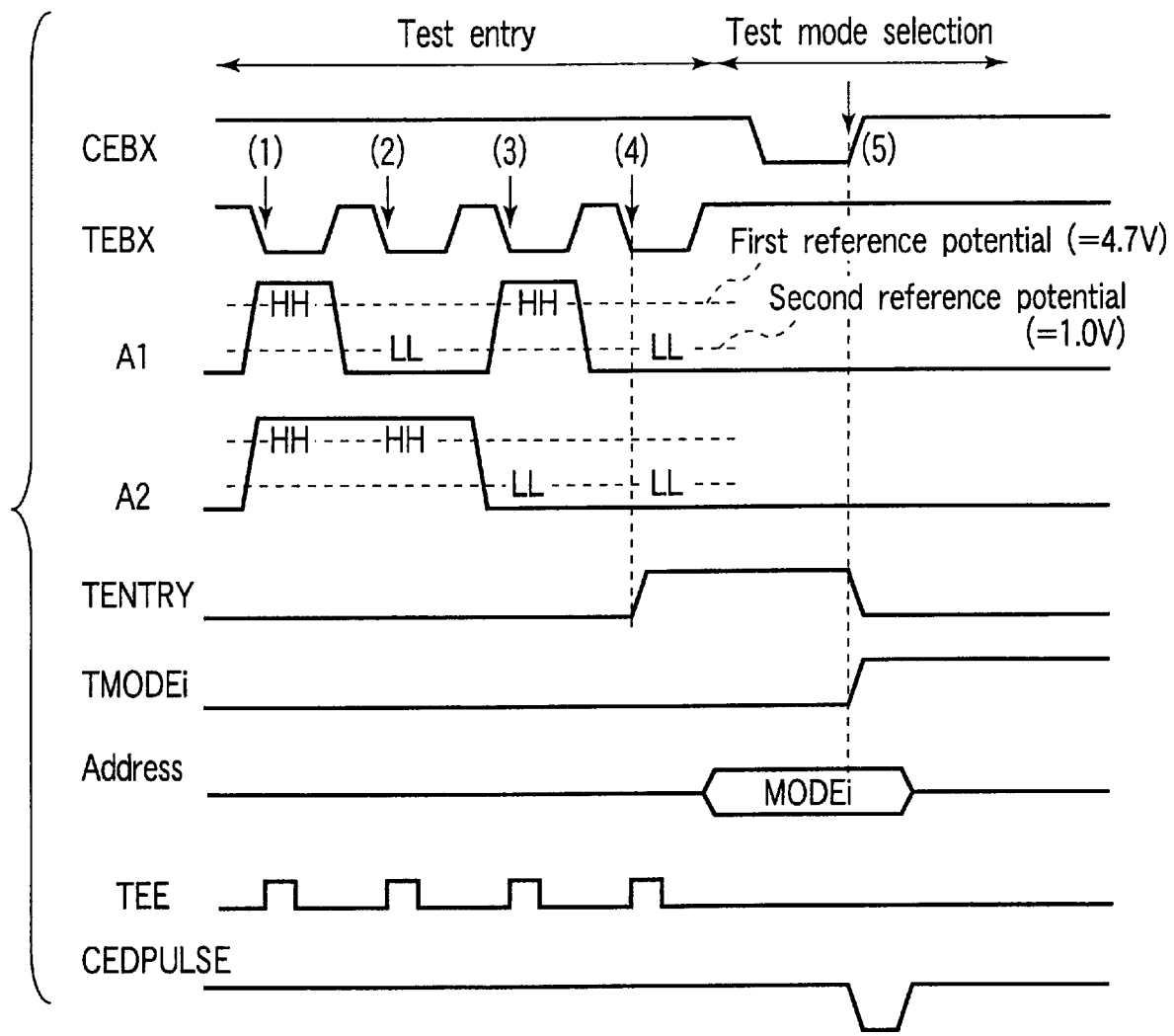
FIG. 10 is a timing waveform diagram of main signals in the second embodiment of the present invention.

FIG. 10 shows timing waveforms of main signals shown in FIG. 9 concerning the test mode entry operation. The operation shown here is a timing waveform for executing a test mode setting that is different from normal read-out operation or write-in operation.

First of all, under a test entry state, the test entry signal TENTRY being a signal at a test mode setting preparation stage changes from an "L" level to an "H" level by the external signal (indicated as A1 and A2 here) and the test enable signal TEBX being a clock signal, and then, at a timing at which the chip enable signal CEBX changes from the "L" level to the "H" level, the test mode signal TMODEi changes from the "L" level to the "H" level so that the test mode is set.

The chip enable signal CEBX, the test enable signal TEBX, and the address signals (indicated as A1 to Ai here) shown here are external input signal, and the test entry signal TENTRY, the test mode signal TMODEi, and the chip enable delay pulse signal CEDPULSE are internal signals generated inside the chip. Here, the chip enable delay pulse signal is a signal resulting from delaying the chip enable signal CEBX that is externally inputted by the delay circuit 11. Moreover, although the address signal A1 functions as an address for selecting the memory cell during the read-out/write-in operation of normal operation of the semiconductor storage apparatus, it is inputted to the voltage detection circuit units $4_1$ and $4_2$ as an entry signal when the test mode is enter.

Moreover, although the address signal A1 and A2 function as an address for selecting the memory cell during the read-out/write-in operation of normal operation of the semiconductor storage apparatus, it is inputted to the voltage detection circuit units $4_1$ and $4_2$ respectively as an entry signal when the test mode is enter.

The test entry signal TENTRY changes from the "L" level to the "H" level when the test entry is established, and changes to the "L" level at a timing at which the test mode signal TMODEi changes to the "H" level. After the test entry, an optional test mode signal TMODEi is selected by using the address signal MODEi, which is a combination of the address signals A1 to Ai. The test mode signals TMODEi are assigned to the combination of plural addresses designating the predetermined test mode and are selected at a timing at which the chip enable signal CEBX changes from the "L" level to the "H" level after the test entry, and they transit from the "L" level to the "H" level.

Next, an explanation will be given of the test entry operation with reference to FIG. 10. The test entry is executed by setting the address signals A1 and A2 to any one of a preset "HH" level or "LL" level while the test enable signal TEBX is clock-operated with the chip enable signal CEBX at the "H" level and with the semiconductor storage apparatus standing-by.

Level setting of the address signals A1 and A2 is executed by setting the first reference potential and the second reference potential at the first voltage detection circuit unit $4_1$ and the second voltage detection circuit unit $4_2$ respectively, and by detecting whether the address signals A1 and A2 are higher or lower than the reference potentials. In this embodiment, the semiconductor storage apparatus with a source voltage of 3.3V is used as an example, and the first reference potential is set to 4.7V, and the second reference potential is set to 1.0V.

Here, it is assumed that reference numeral LL indicates a voltage being lower than the second reference voltage, and reference numeral HH indicates a voltage being higher than the first reference voltage. As shown in FIG. 10, a pulse sequence of four pulses 1 to 4 is given to the test enable signal TEBX at the time of the test entry, and the address signal A1 is set to HH and the address signal A2 is set to HH at the falling of the first TEBX pulse, the address signal A1 is set to LL and the address signal A2 is set to HH at the falling of the second TEBX pulse, the address signal A1 is set to HH and the address signal A2 is set to LL at the falling of the third TEBX pulse, and the address signal A1 is set to LL and the address signal A2 is set to LL at the falling of the fourth TEBX pulse. The test entry is established by, when the output signal of the test enable buffer 2 and the level detection enable signal TEDE are at the "L" level, activating the first voltage detection circuit unit $4_1$ and the second voltage detection circuit unit $4_2$, and inputting the entry signal corresponding to the input signal Ai to the test entry setting circuit 7. A pulse width of the test enable signal TEE is, for example, about 20 ns.

When the pulse sequence is inputted, the test entry signal TENTRY changes to the "H" level at the timing of the fourth pulse of the test enable signal TEBX so that the test entry is established. After the test entry is established, the test mode is selected by the pulse of the chip enable signal CEBX that is transition state from the "H" level to the "L" level, and then to the "H" level. The test mode entry setting circuit 7 takes in the address combination MODEi at the pulse of the chip enable signal CEBX, and selects a specific mode from plural test modes TMODEi corresponding to the address combination.

When the chip enable signal CEBX changes from the "L" level to the "H" level, the specific test mode signal TMODEi changes to the "H" level while the chip enable delay pulse signal CEDPULSE changes from the "H" level to the "L" level, and the test entry signal TENTRY changes to the "L" level all at the same time.

As mentioned above, the test mode setting operation is to execute the test entry first, and then select the test mode after the test entry is established. That is, the test entry operation is set by a combination of the level setting of the address signals A1 and A2 and the predetermined pulses of the test enable signal TEBX.

The test mode selection operation is executed by the clock operation of the chip enable signal CEBX and the setting of the address signals A1 to Ai.

With a combination of the test entry operation and the test mode selection operation, the operation of the test mode entry is completed. An optional test mode setting can be executed in this manner. That is, plural sorts of test modes are previously prepared according to the setting of the address signal, the optional test operation becomes possible by using the combination of the designated address signals.

Moreover, concerning cancellation of the test operation, changing from the test mode to the normal operation becomes possible by assigning a mode of test cancellation to the selection of the test mode, and by selecting the test cancellation after the test entry operation in a similar manner to the test mode setting. Such a test entry method can realize a test circuit with a high variance by using a structure with one entry circuit and plural selection circuits such as the selection of the test mode, the combination of plural test modes, and the cancellation of the test mode.

Moreover, the test entry operation is not limited to potential level states of the address signals A1 and A2 shown in FIG. 10, and it can be set as an optional combination of potential levels.

Figure 11:
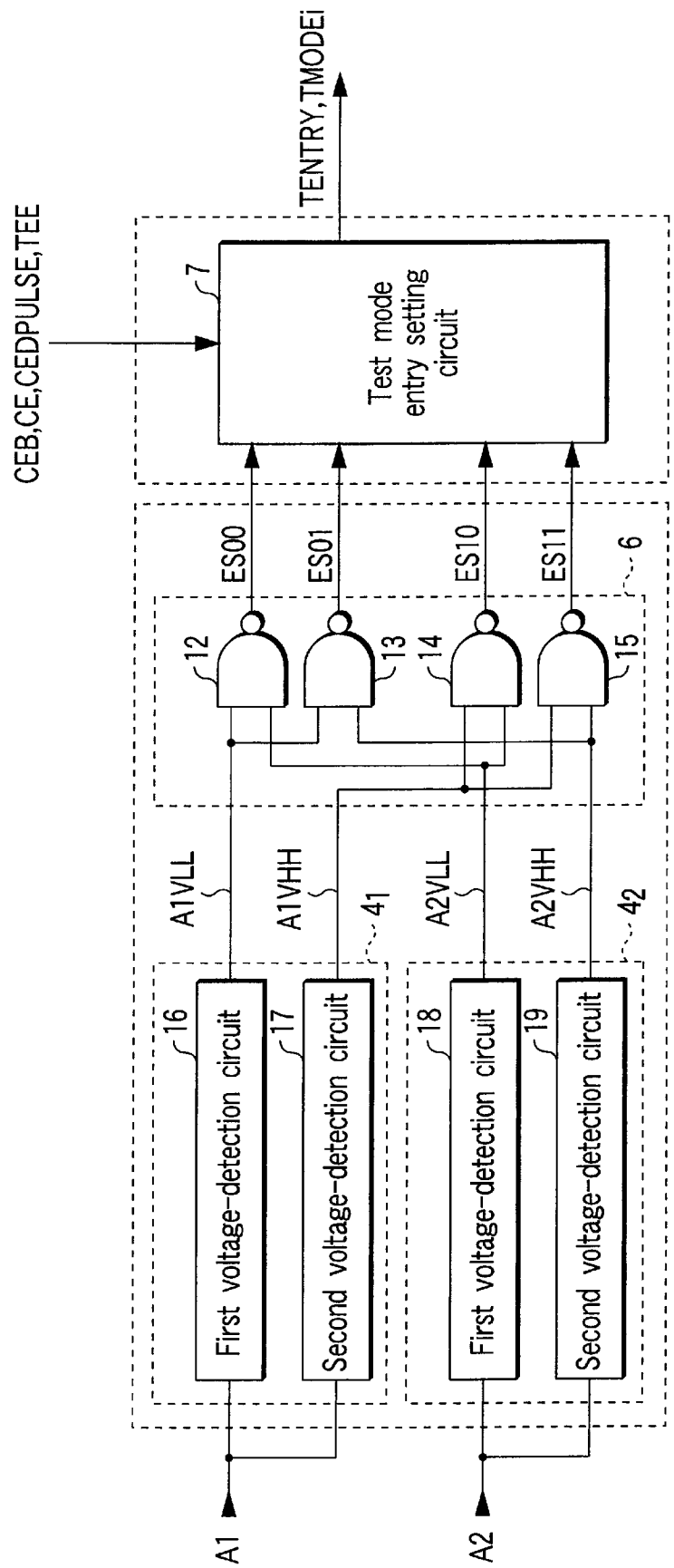
FIG. 11 is a structural diagram showing a voltage detection circuit unit, a decode circuit, a test mode entry setting circuit in the second embodiment of the present invention.

Next, FIG. 11 is a block diagram of the two voltage detection circuit units 41 and 42 the decode circuit 6, and the test mode entry setting circuit 7 in FIG. 9 showing this embodiment. The decode circuit 6 comprises the first to fourth NAND circuits 12, 13, 14, and 15.

The output signal A1VLL from the first voltage detection circuit 16 in the first voltage detection circuit unit $4_1$ and the output signal A2VLL from the first voltage detection circuit 18 in the second voltage detection circuit unit $4_2$ are inputted to and the output signal ES00 is outputted from the first NAND circuit 12. Besides, the first voltage detection circuit unit $4_1$ and the second voltage detection circuit unit $4_2$ are both similar to the voltage detection circuit unit 4 in FIG. 1, and their concrete structures are similar to that of the voltage detection circuit unit 4 and are shown in FIG. 5.

The output signal A1VLL from the first voltage detection circuit 16 in the first voltage detection circuit unit $4_1$ and the output signal A2VHH from the second voltage detection circuit 19 in the second voltage detection circuit unit $4_2$ are inputted to and the output signal ES01 is outputted from the second NAND circuit 13.

The output signal A1VHH from the second voltage detection circuit 17 in the first voltage detection circuit unit $4_1$ and the output signal A2VLL from the first voltage detection circuit 18 in the second voltage detection circuit unit $4_2$ are inputted to and the output signal ES10 is outputted from the third NAND circuit 14.

The output signal A1VHH from the second voltage detection circuit 17 in the first voltage detection circuit unit $4_1$ and the output signal A2VHH from the second voltage detection circuit 19 in the second voltage detection circuit unit $4_2$ are inputted to and the output signal ES11 is outputted from the fourth NAND circuit 15.

That is, the decode circuit 6 takes a combination of the output signals A1VLL, A1VHH, A2VLL, and A2VHH from the first and the second voltage detection circuit units $4_1$ and 42, and outputs four output signals ES00, ES01, ES10, and ES11. The test mode entry setting circuit 7 is a circuit for judging whether or not the address signals A1 and A2 are inputted in order of (A1, A2)=(HH, HH), (LL, HH), (HH, LL), (LL, LL) respectively at timings of displacement of the four pulses of the test enable signal TEBX from the "H" level to the "L" level, by receiving the output signals from the first and the second voltage detection circuit unit $4_1$ and $4_2$ via the decode circuit 6, and if the input is correctly executed in order, the test entry signal TENTRY changes to the "H" level.

Here, concrete circuits of the low-level detection circuits 16 and 18 and the high-level detection circuits 17 and 19 are similar to the circuit that is used in the first embodiment, and is shown in FIG. 5.

Next, FIG. 12 shows a concrete structure example of a main part of the test mode entry setting circuit 7. The output signals ES11, ES10, ES01, and ES00 from the decode circuit 6 are the input signals of this circuit, and the circuit outputs the test entry signal TENTRY. The four output signals from the decode circuit 6 are received by the four-stage latch circuits.

That is, the circuit constitutes a shift register circuit resulting from connecting in serial; the first-stage latch circuit composed of two NAND circuits NAND811 and NAND812, and an inverter INV813; the second-stage latch circuit composed of two NAND circuits NAND821 and NAND822, and an inverter INV823; the third-stage latch circuit composed of two NAND circuits NAND831 and NAND832, and an inverter INV833; and the fourth-stage latch circuit composed of two NAND circuits NAND841 and NAND842, and an inverter INV843.

Here, the output signals ES11, ES10, ES01, and ES00 from the decode circuit 6 are inputted to the NAND circuits NAND812, NAND822, NAND832, and NAND842 respectively.

Moreover, the test mode entry setting circuit 7 is constituted by a logic circuit comprising a NAND circuit NAND851 whose input signals are the T1 to T4 outputted respectively from the four-stage latch circuits, an inverter INV852 to which the output from the NAND circuit NAND851 is inputted, a NAND circuit NAND853 to which the chip enable signal CE and the output from the NAND circuit NAND851 are inputted, a NAND circuit NAND854 to which the output signal from the NAND circuit NAND853 and the chip enable delay pulse signal CEDPULSE are inputted, and an inverter INV855 to which the output from the NAND circuit NAND854 is inputted.

Here, the test reset signal TRESET is outputted from the inverter INV855, and is inputted to the NAND circuits NAND811, NAND821, NAND831, and NAND841. After the test entry is set and the test entry signal TENTRY changes to the "H" level, the shift register in the test mode entry setting circuit 7 is reset at the timing of the setting of the test mode selection at the timing of the transition of the chip enable signal CEBX from the "L" level to the "H" level.

Moreover, in a state of active operation, which is normal operation, the chip enable signal CE is at the "H" level, and when T1 to T4 are all at the "L" level and the output from the NAND circuit NAND851 is at the "H" level, the test reset signal TRESET is compulsorily made to be at the "L" level, and the shift register is reset.

Here, an explanation will be given of the test entry mode setting operation.

Before the state becomes a test mode entry state, the output signals ES11, ES10, ES01, and ES00 from the decode circuit 6 are at the "H" level.

There is beforehand inputted the pulse for transition of the reset signal TRESET from the "H" level to the "L" level and then to the "H" level, the latch circuits of the first to fourth stages in the test mode entry setting circuit 7 shown in FIG. 12 are reset respectively. Moreover, the outputs T1, T2, T3, and T4 from the inverters INV813, INV823, INV833, and INV843 all transit to the "L" level. The reset operation can be executed during power charge or by an external control.

Moreover, the output from the NAND circuit NAND851 to which the output signals T1 to T4 from the inverter are inputted changes to the "H" level, and the test entry signal TENTRY that is the output from the inverter INV852 changes to the "L" level. During standby, the chip enable signal CE is at the "L" level, the chip enable delay pulse signal CEDPULSE is at the "H" level, and the reset signal RESETB is also at the "H" level so that the output from the NAND circuit NAND853 changes to the "H" level, and the test reset signal TRESET being the output from the NAND circuit NAND854 changes to the "H" level state.

When the state becomes the test entry state, and the address signals A1 and A2 are both under the "HH" state at first as shown in FIG. 10 and are inputted as a pulse signal for transition of the test enable signal TEBX from the "H" level to the "L" level and then to the "H" level, only the output ES11 from the decode circuit 6 changes from the "H" level to the "L" level, the output from the NAND circuit NAND812 changes from the "L" level to the "H" level, the output from the NAND circuit NAND811 changes from the "H" level to the "L" level, the output signal T1 from the inverter INV813 changes from the "L" level to the "H" level, and the output signal T1 is latched to the "H" level.

Next, when the address signal A1 is at the "LL" level and the address signal A2 is at the "HH" level, with the second pulse of the test enable signal TEBX, only the output ES10 from the decode circuit 6 changes from the "H" level to the "L" level, the output from the NAND circuit NAND822 changes from the "L" level to the "H" level, the output from the NAND circuit NAND821 changes from the "H" level to the "L" level, the output signal T2 from the inverter INV813 changes from the "L" level to the "H" level, and the output signals T1 and T2 are latched to the "H" level.

Moreover, the address signal A1 is set to the "HH" level and the address signal A2 is set to the "LL" level with the third pulse of the test enable signal TEBX, only the output ES01 from the decode circuit 6 changes from the "H" level to the "L" level, the output from the NAND circuit NAND832 changes from the "L" level to the "H" level, the output from the NAND circuit NAND831 changes from the "H" level to the "L" level, the output signal T3 from the inverter INV833 changes from the "L" level to the "H" level, and the output signals T1 to T3 are latched to the "H" level.

Next, the address signals A1 and A2 are set to the "LL" level with the fourth pulse of the test enable signal TEBX, only the output ES00 from the decode circuit 6 changes from the "H" level to the "L" level, the output from the NAND circuit NAND842 changes from the "L" level to the "H" level, the output from the NAND circuit NAND841 changes from the "H" level to the "L" level, the output signal T4 from the inverter INV843 changes from the "L" level to the "H" level, and the output signals T1 to T4 are latched to the "H" level.

When all the signals T1 to T4 transit to the "H" level, the output from the NAND circuit NAND851 changes from the "H" level into the "L" level, and the test entry signal TENTRY being the output from the inverter INV852 changes from the "L" level to the "H" level.

In this manner, by the test entry signal TENTRY transiting to the "H" level, the test mode selection operation is executed next.

Here, a circuit structure of the test mode signal generation circuit in the test mode entry setting circuit 7 is similar to that of the test mode signal generation circuit shown in FIG. 8 in the first embodiment.

Here, the test mode setting is executed by using two addresses so that there is a lower possibility that the mode is falsely set to the test mode, than the case where the test mode is set by using one address.

Moreover, in this embodiment, a number of address signal lines used for the test mode setting is about two, which is small, the entry can be done by only a few stages, and a penalty of a chip area is extremely small.

Moreover, this embodiment has a similar effect to that of the first embodiment.

(Third Embodiment)

An explanation will be given of a semiconductor storage apparatus according to a third embodiment of the present invention with reference to FIG. 13.

Figure 13:
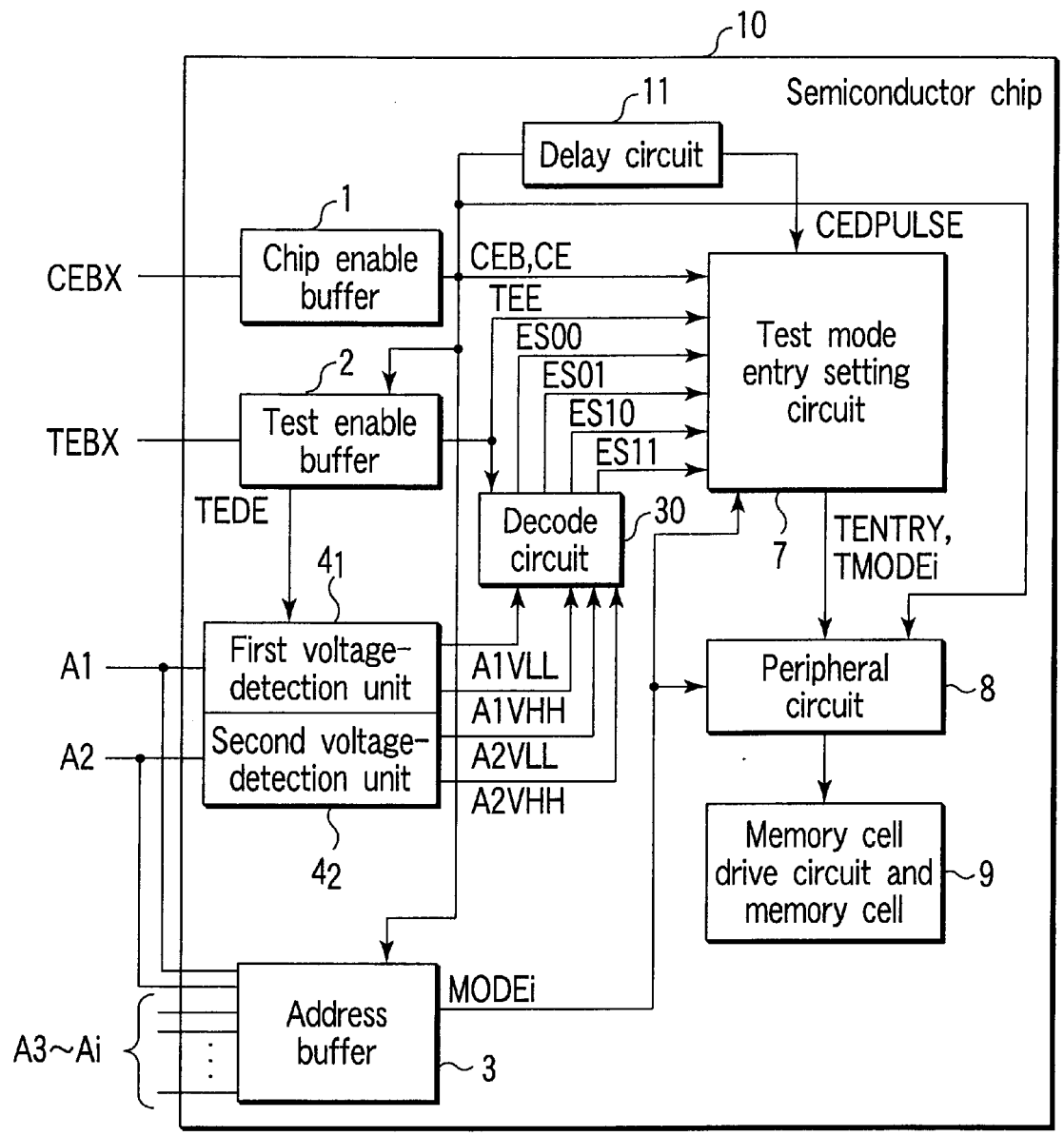
FIG. 13 is a block diagram of an entire structure of a third embodiment of the present invention.

In a structural diagram of this embodiment shown in FIG. 13, the semiconductor storage apparatus comprises a semiconductor chip enable buffer 1, a test enable buffer 2, an address buffer 3, a first voltage detection circuit unit $4_1$, a second voltage detection circuit unit $4_2$, a decode circuit 30, a test mode entry setting circuit 7, a peripheral circuit 8, a memory cell drive circuit and memory cell 9, and a delay circuit 11. Here, it is sufficient that the memory cell is constituted by a semiconductor memory, and for example, a ferroelectric memory or a flash memory can be applied.

Figure 14:
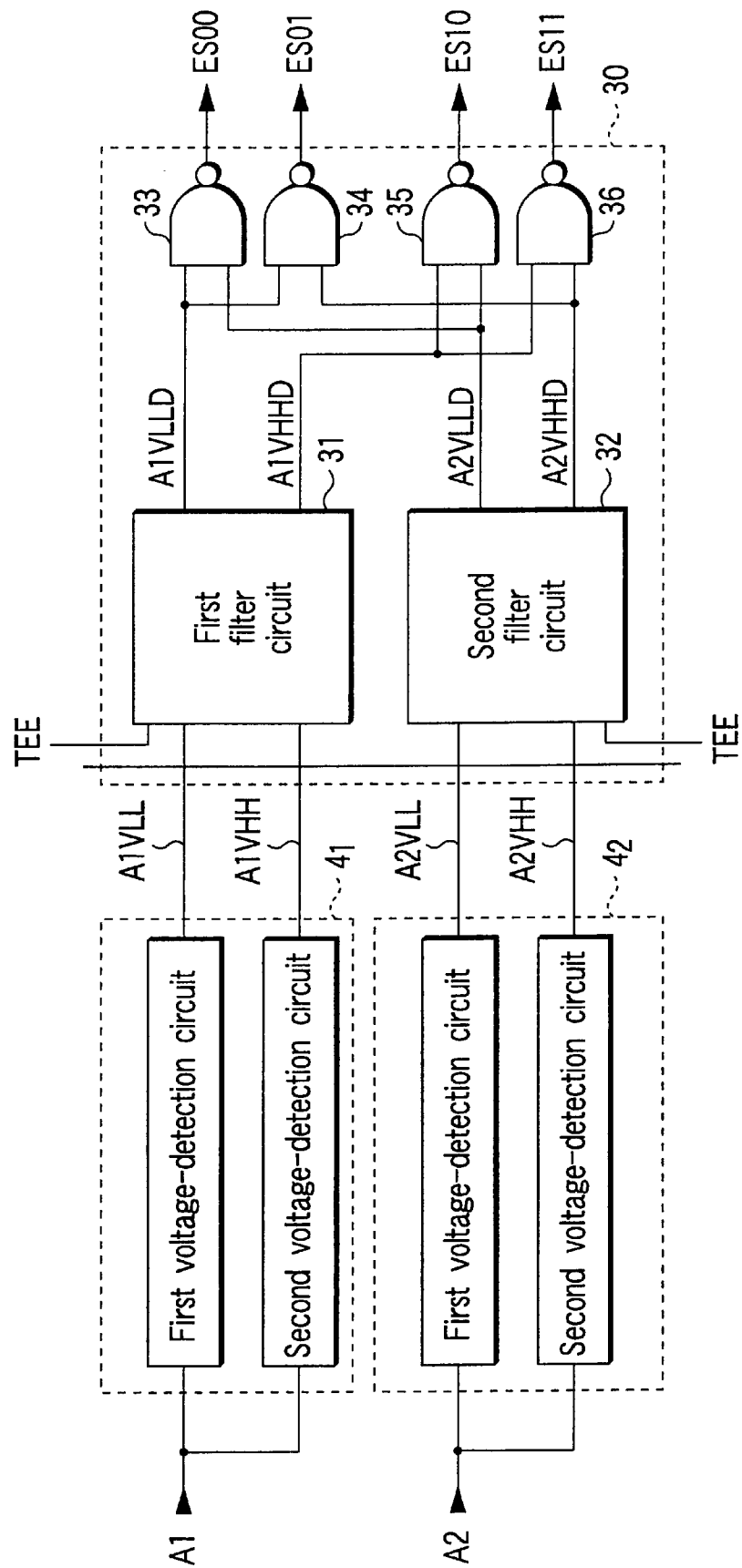
FIG. 14 is a structural diagram showing a voltage detection circuit unit and a decode circuit in the third embodiment of the present invention.

FIG. 14 shows a structure of voltage detection circuit units $4_1$ and $4_2$ and a decode circuit 30 in this embodiment.

Basic structures of this embodiment besides the structure shown in FIG. 14 are similar to those of the second embodiment shown in FIG. 9.

As shown in FIG. 14, the output signals A1VLL, A1VHH, A2VLL, and A2VHH from the two voltage detection circuit units $4_1$ and $4_2$ are inputted to and the output signals ES00, ES01, ES10, and ES11 are outputted from the decode circuit 30 in a similar manner to the second embodiment.

Here, in the decode circuit 30, two filter circuits 31 and 32 are provided among the input signals and the four NAND circuits 33, 34, 35, and 36. To the first filter circuit 31, the test enable pulse signal TEE, the output signal A1VLL from the low-level detection circuit in the first voltage detection circuit unit $4_1$, and the output signal A1VHH from the high level detection circuit are inputted. To the second filter circuit 32, the test enable pulse signal TEE, the output signal A2VLL from the low-level detection circuit in the second voltage detection circuit unit 42, and the output signal A2VHH from the high level detection circuit are inputted.

To the first NAND circuit 33, the waveform-shaped low-level detection signal A1VLLD is inputted from the first filter circuit 31, and the waveform-shaped low-level detection signal A2VLLD is inputted from the second filter circuit 32. To the second NAND circuit 34, the waveform-shaped low-level detection signal A1VLLD is inputted from the first filter circuit 31, and the waveform-shaped high-level detection signal A2VHHD is inputted from the second filter circuit 32.

To the third NAND circuit 35, the waveform-shaped high-level detection signal A1VHHD is inputted from the first filter circuit 31, and the waveform-shaped low-level detection signal A2VLLD is inputted from the second filter circuit 32. To the fourth NAND circuit 36, the waveform-shaped high-level detection signal A1VHHD is inputted from the first filter circuit 31, and the waveform-shaped high-level detection signal A2VHHD is inputted from the second filter circuit 32.

Figure 17:
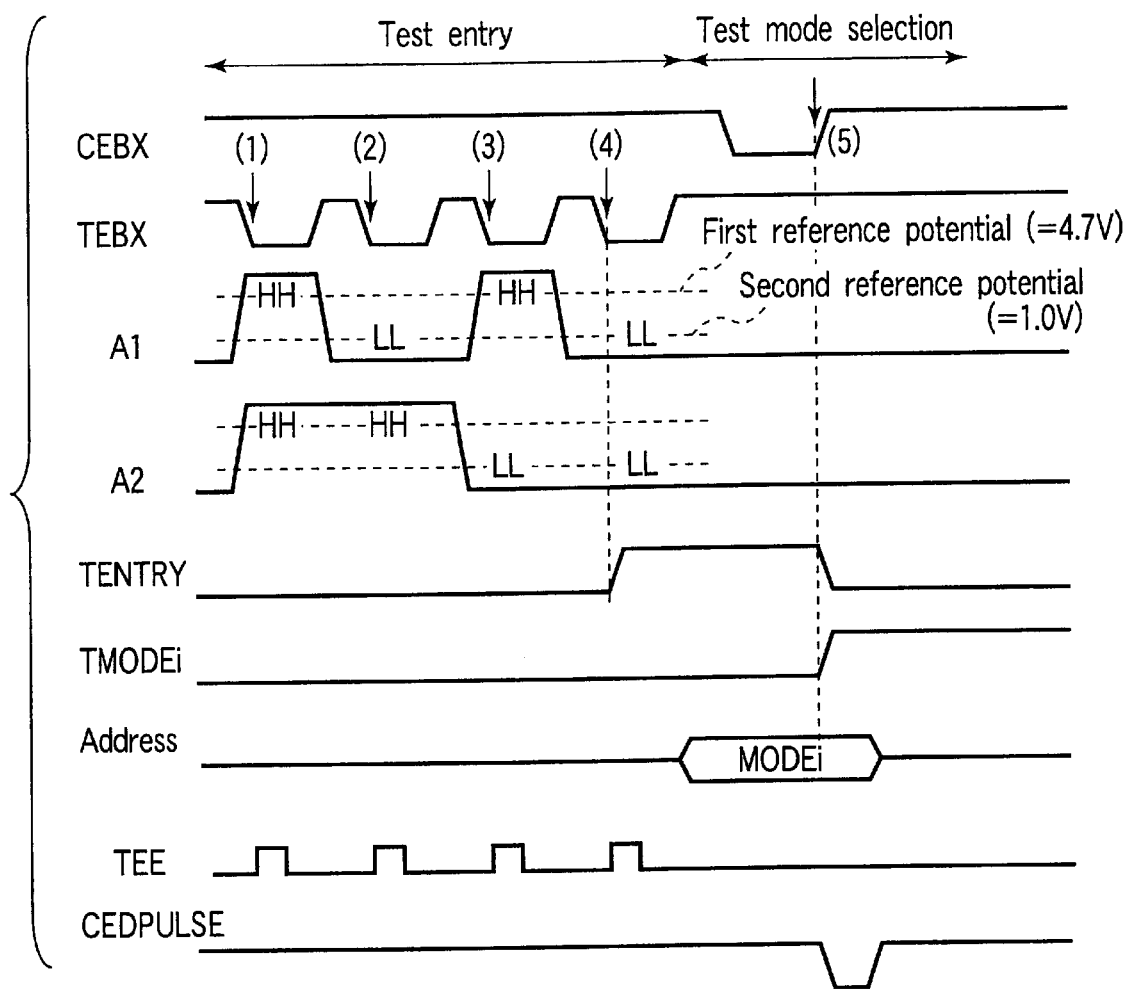
FIG. 17 is a timing waveform diagram of main signals in the third embodiment of the present invention.

FIG. 17 shows timing waveforms of main signals in the third embodiment. Here, the test enable pulse signal TEE is generated so as to become a pulse of a rectangular wave at a timing of fall of the pulse of the test enable signal TEBX under the test mode entry state. Here, a pulse width of the test enable pulse signal TEE is set at, for example, about 20 ns.

Figure 15:
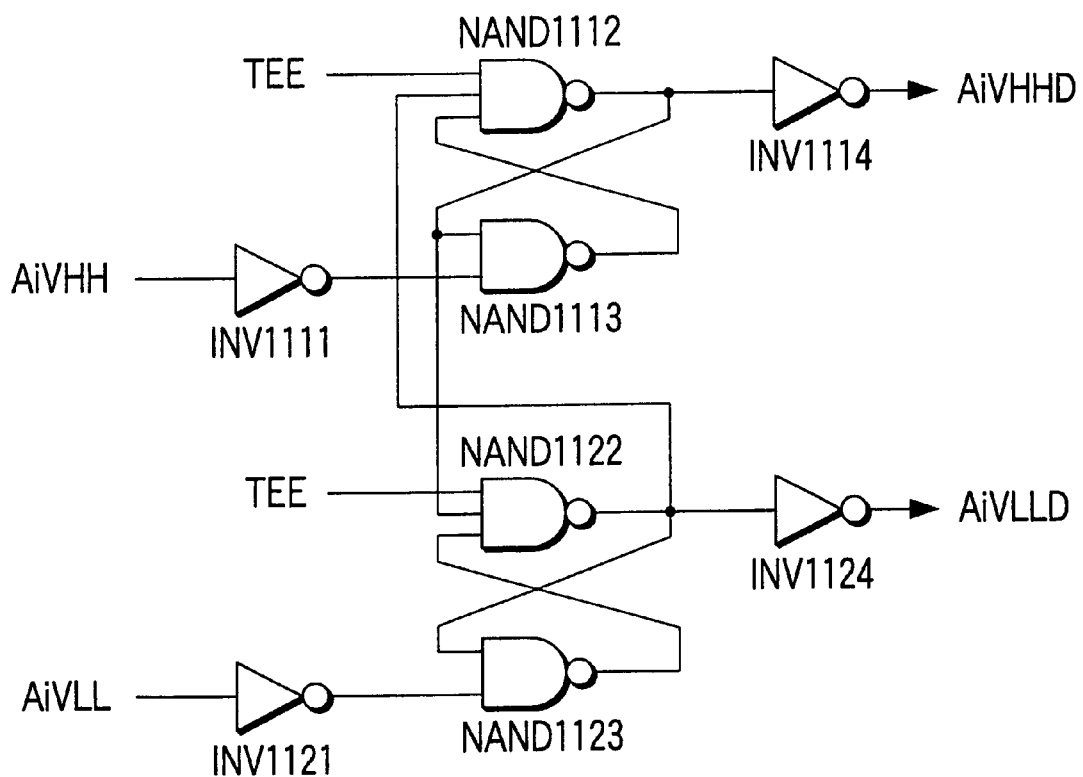
FIG. 15 is a circuit diagram of a filter circuit in the third embodiment of the present invention.

Next, FIG. 15 shows a concrete structure example of the filter circuits 31 and 32. Although one of the two filter circuits in FIG. 14 is shown in FIG. 15, the other has a similar structure.

The filter circuits 31 and 32 comprise the first voltage detection circuit for outputting the waveform-shaped output AiVLLD (i is a natural number) from the low-level detection circuit, and the second voltage detection circuit for outputting the waveform-shaped output AiVHHD (i is a natural number) from the high-level detection circuit.

The first voltage detection circuit of the filter circuit comprises a third inverter INV1211 whose input signal is the output signal AiVLL (i is a natural number) from the low-level detection circuit, the two NAND circuits NAND1122 and NAND1123 whose input signals are the test enable pulse signal TEE and the output from the third inverter INV1121 respectively and that are connected to each other, and the fourth inverter INV1124 to which the output signal from the NAND1122 is inputted and the latched signal AiVLLD is outputted.

The second voltage detection circuit of the filter circuit comprises the first inverter INV1111 whose input signal is the output signal AiVHH (i is a natural number) from the high-level detection circuit, the two NAND circuits NAND1112 and NAND1113 whose input signals are the test enable pulse signal TEE and the output from the first inverter INV1111 respectively and that are connected to each other, and the second inverter INV1114 to which the output signal from the NAND1112 is inputted and the latched signal AiVHHD is outputted.

Moreover, the output signal from the NAND circuit NAND1122 in the first voltage detection circuit is inputted to the NAND circuit NAND1112 in the second voltage detection circuit, and the output signal from the NAND circuit NAND1112 in the second voltage detection circuit is inputted to the NAND circuit NAND1122 in the first voltage detection circuit.

In this embodiment, there is also used the test enable buffer 2 shown in FIG. 20 having a similar structure and function to those in the first embodiment.

FIG. 16 shows a structure shown in FIG. 14 combined in the structure of the semiconductor storage apparatus in FIG. 13. However, in FIG. 16, the test mode entry setting circuit 7, the peripheral circuit 8, and the memory cell drive circuit and memory cell 9 are omitted.

Concerning the operation of this embodiment, at first, before the test mode entry, the output signals AiVHH and AiVLL from the level detection circuit are both at the "L" level, the test enable pulse signal TEE is at the "L" level, and the output signals AiVHHD and AiVLLD from the decode circuit are both at the "L" level.

Under the test mode entry state, when the input address signal Ai to the voltage detection circuit unit is 4.7V or more, the output signal AiVHH from the level detection circuit is at the "H" level, and when the input address signal Ai is 1.0V or less, the output signal AiVLL from the level detection circuit is at the "H" level.

Here, an explanation will be given of the case where the AiVHH changes to the "H" level as an example.

At first, the output from the first inverter INV1111 changes to the "L" level, and the output from the NAND circuit NAND1113 changes to the "H" level. Here, there is sustained a state in which the AiVLL is at the "L" level, and the output from the NAND circuit NAND1122 is at the "H" level.

Next, during pulse input of the test enable signal TEBX (during fall), there is generated the rectangular-shaped pulse in which the test enable pulse signal TEE is at the "H" level for a fixed time. While the test enable pulse signal TEE is at the "H" level, the output from the first NAND circuit NAND1112 is fixed at the "L" level, and the output signal AiVHHD from the second inverter INV1114 is fixed at the "H" level.

While the test enable pulse signal TEE is at the "H" level, the output from the NAND circuit NAND1112 is fixed at the "L" level, and the output from the NAND circuit NAND1122 is fixed at the "H" level so that the state of the latch circuit does not change even if the outputs AiVHH and AiVLL from the voltage detection circuit unit fractures, and the output signal AiVHHD from the filter circuit 31 is fixed at the "H" level, and the output signal AiVLLD from the filter circuit 32 is fixed at the "L" level.

When the test enable pulse signal TEE changes back to the "L" level, the outputs from the NAND circuits NAND1112 and NAND1122 both transit to the "H" level, and the output signal AiVHHD from the second inverter INV1114 and the output signal AiVLLD from the fourth inverter INV1124 both transit to the "L" level.

In a similar manner, when the test enable pulse signal TEE is given under the state in which the output AiVLL from the voltage detection circuit unit is at the "H" level, the output signal AiVLLD from the filter circuit 31 is fixed to the "H" level, and the output signal AiVHHD from the filter circuit 32 is fixed to the "L" level while the pulse signal TEE is at the "H" level.

Moreover, although the address signals A1 and A2 function as addresses for memory cell selection during read-out/write-in operation, which is a normal operation of the semiconductor storage apparatus, during the test mode entry, they are inputted to the voltage detection circuit units $4_1$ and $4_2$ respectively as entry signals.

Although this embodiment is composed by combining with the second embodiment, combining this embodiment with the first embodiment is also possible. In that case, a structure with one filter circuit is taken.

The test mode entry circuit being stronger against fracture of the input signal can be realized by providing the filter circuits 31 and 32 with such a structure inside the decode circuit 30.

This embodiment has a similar effect to the first embodiment.

(Fourth Embodiment)

An explanation will be given of a semiconductor storage apparatus in the third embodiment of the present invention with reference to FIG. 18.

In a structural diagram of this embodiment shown in FIG. 18, the semiconductor storage apparatus comprises a semiconductor chip enable buffer 1, a test enable buffer 2, an address buffer 3, a voltage detection circuit unit 40, a test mode entry setting circuit 7, a peripheral circuit 8, a memory cell drive circuit and memory cell 9, and a delay circuit 11. Here, it is sufficient that the memory cell is constituted by a semiconductor memory, and for example, a ferroelectric memory or a flash memory can be applied.

That is, comparing with the semiconductor storage apparatus in the first embodiment, the voltage detection circuit unit 40 shown in FIG. 19 is used instead of the voltage detection circuit unit 4. The other structures are similar to those in the first embodiment. FIG. 19 shows the structure of the voltage detection circuit unit 40 in this embodiment. The circuit is used in the semiconductor storage apparatus for making fall the source voltage inside the chip as oppose to an external power supply. This circuit has a structure in which a signal input portion corresponds to an external power Vcc, and the voltage of a signal output portion is converted into a signal of an internal voltage Vint system.

Here, the input signal Vin is inputted to and a low-level potential detection output signal VLL is outputted from the first voltage detection circuit 46, and the input signal Vin is inputted to and a high-level potential detection output signal VHH is outputted from the second voltage detection circuit 47.

In the first voltage detection circuit 46, a NOR circuit composed of six transistors M1511 to M1516, an inverter at the next stage composed of transistors M1517 and M1518, and an inverter connected to a level conversion circuit composed of transistors M1519 and M1520 are composed of a circuit of the external power Vcc system; and a level shifter circuit composed of transistors M1521, M1522, M1523, and M1524, and an inverter INV1525 receiving the output from the level shifter circuit are composed of a circuit of the internal power Vint system.

The first voltage detection circuit 46 has a similar structure to the first voltage detection circuit 16 in the first embodiment shown in FIG. 5 in which the inverter INV619 is eliminated, and the inverters M1519, M1520 and INV1525, and the transistors M1521, M1522, M1523, and M1524 are newly provided.

In the second voltage detection circuit 47, the first stage to which the input signal Vin composed of the M1531, M1532, and M1533 is inputted, and the inverter at the next stage composed of the M1534 and M1535 are composed of the external power Vcc system; and the NOR1536 to which an output signal CE from a CE buffer that is at the "H" level during activity and at the "L" level during standby and the output from the next-stage inverter are inputted is constituted by the transistor of the Vint system. The second voltage detection circuit 47 has a similar structure to the second voltage detection circuit 17 in the first embodiment shown in FIG. 5 in which the NOR circuit NOR626 is eliminated, and the NOR circuit NOR1536 is newly provided.

Moreover, although the address signal A1 functions as an address for memory cell selection during readout/write-in operation, which is a normal operation of the semiconductor storage apparatus, it is inputted to the voltage detection circuit unit 40 as an entry signal during test mode entry.

This embodiment has a similar effect to any one of the first to the third embodiments.

Since the operation and an operation timing waveform of this embodiment are similar to those in the first embodiment, explanations thereof are omitted. Besides, in a similar manner to this embodiment, the voltage detection circuit unit 40 shown in FIG. 19 can be used instead of the voltage detection circuit units 4, $4_1$, and $4_2$ in all the other embodiments.

(Fifth Embodiment)

An explanation will be given of a semiconductor storage apparatus in the fifth embodiment of the present invention with reference to FIG. 21.

Figure 21:
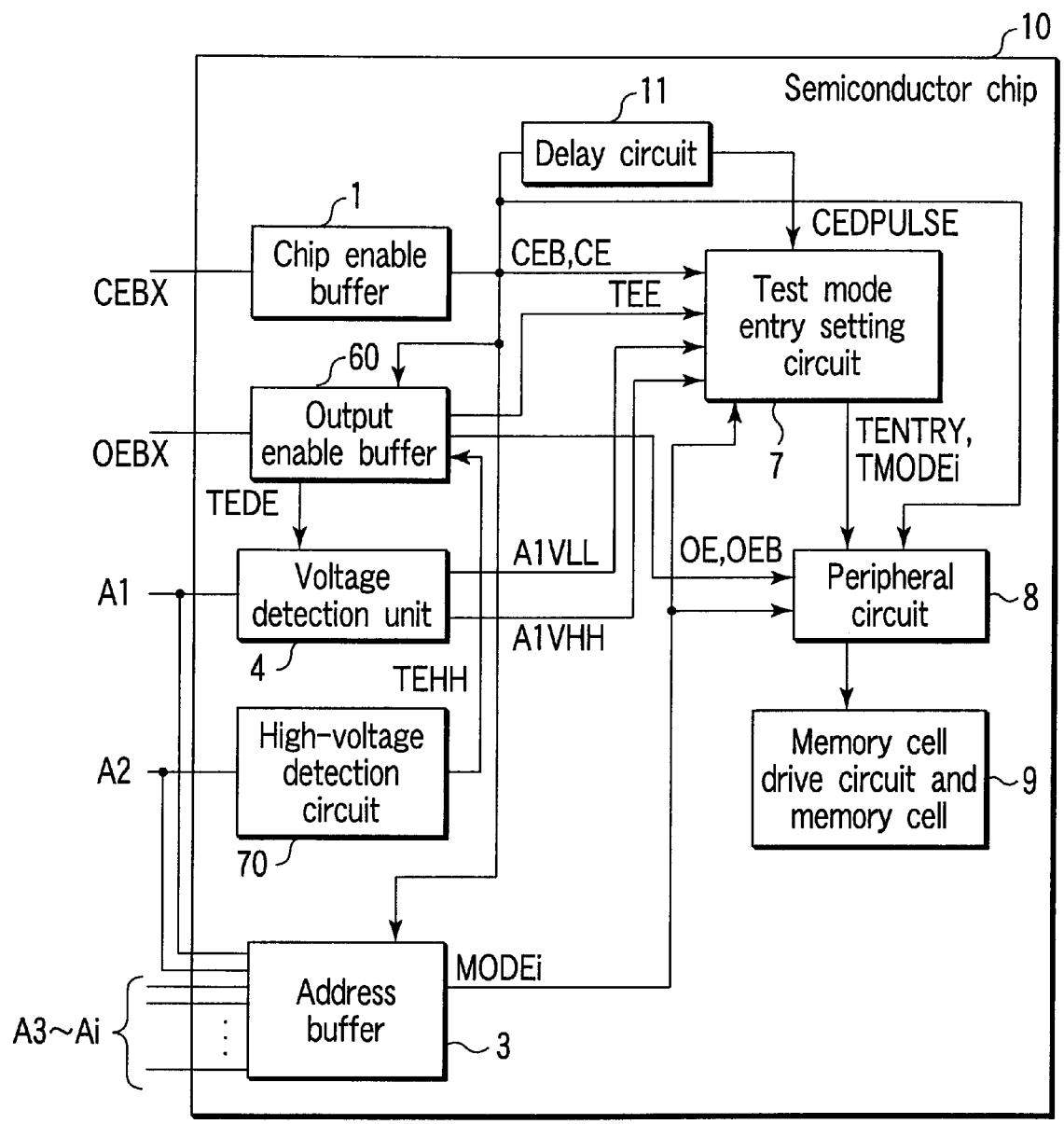
FIG. 21 is a block diagram of an entire structure of a fifth embodiment of the present invention.

In a structural diagram of this embodiment shown in FIG. 21, the semiconductor storage apparatus comprises a semiconductor chip enable buffer 1, an output enable buffer 60, an address buffer 3, the voltage detection circuit unit 4, a high-voltage detection circuit 70, a test mode entry setting circuit 7, a peripheral circuit 8, a memory cell drive circuit and memory cell 9, and a delay circuit 11. The memory cell may be composed of a semiconductor memory, and for example, a ferroelectric memory or a flash memory can be applied.

That is, in comparison with the semiconductor storage apparatus in the first embodiment, the output enable buffer 60 is provided instead of the test enable buffer 2, and the high-voltage detection circuit 70 is added.

The external signal OEBX is inputted to and the test enable signal TEE, the output enable signals OE and OEB are outputted from the output enable buffer 60. The test enable signal TEE is inputted to the test mode entry setting circuit 7, and the output enable signals OE and OEB are inputted to the peripheral circuit 8.

In this embodiment, the address A2 is inputted to and a control signal TEHH for controlling the output enable buffer 60 is outputted from the high-voltage detection circuit 70. The control signal TEHH is inputted to the output enable buffer 60. To the address buffer 3, the address A1 inputted to the voltage detection circuit unit 4, the address A2 inputted to the high-voltage detection circuit 70, and the addresses A3 to Ai (i is a natural number) are inputted. A basic structure of the semiconductor storage apparatus in this embodiment is similar to that of the semiconductor storage apparatus in the first embodiment besides these structures.

Figure 22:
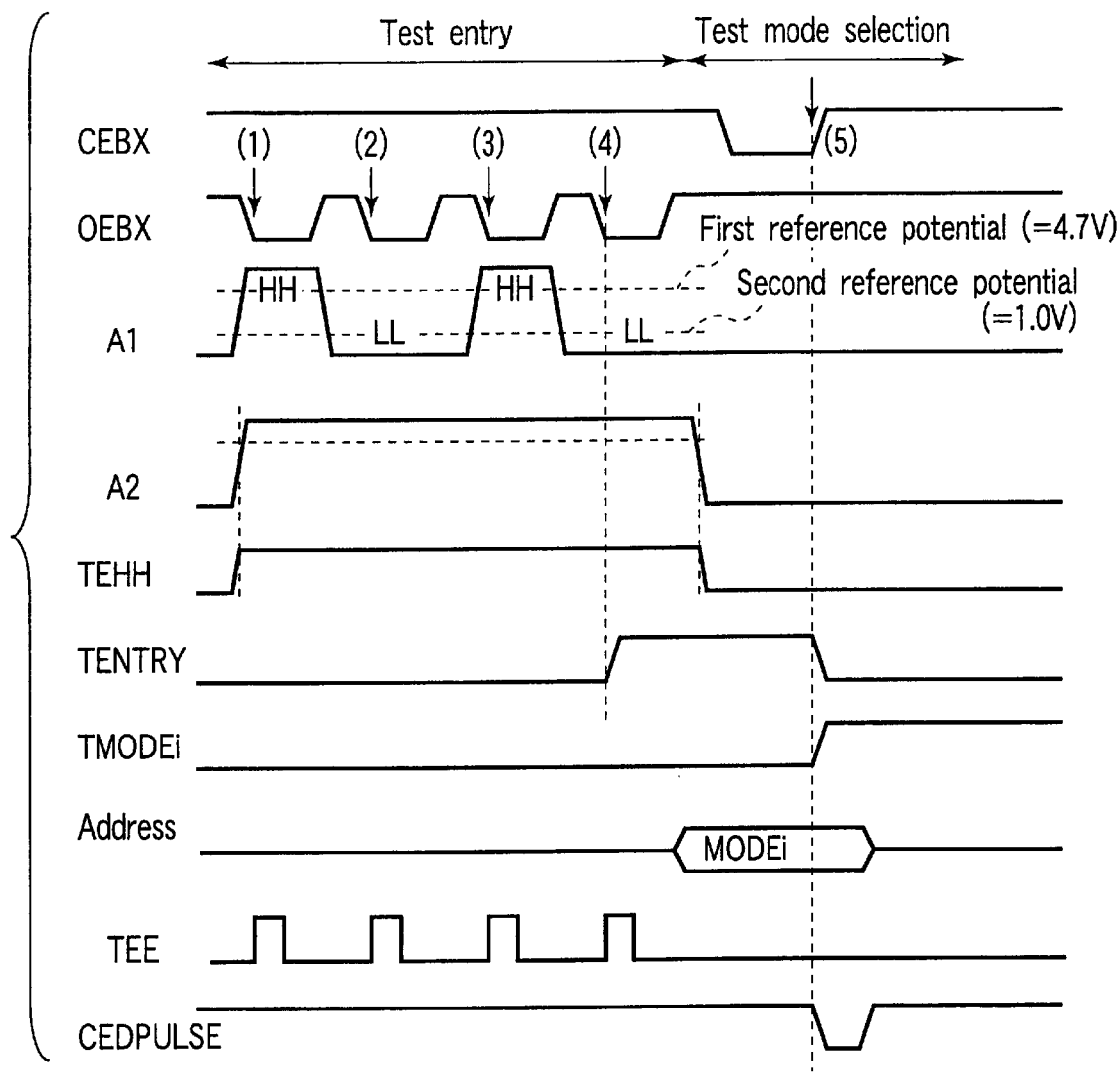
FIG. 22 is a timing waveform diagram of main signals in the fifth embodiment of the present invention.

FIG. 22 shows timing waveforms of main signals of this embodiment. As shown in FIG. 22, the waveform of the output enable signal OEBX corresponds to the waveform of the test enable signal TEBX in the first embodiment. That is, concerning the pulse signal of the output enable signal OEBX, the input signal of the address signal A1 is at the HH at the first pulse, the input signal of the address signal A1 is at the LL at the second pulse, the input signal of the address signal A1 is at the HH at the third pulse, and the input signal of the address signal A1 is at the LL at the fourth pulse.

Figure 23:
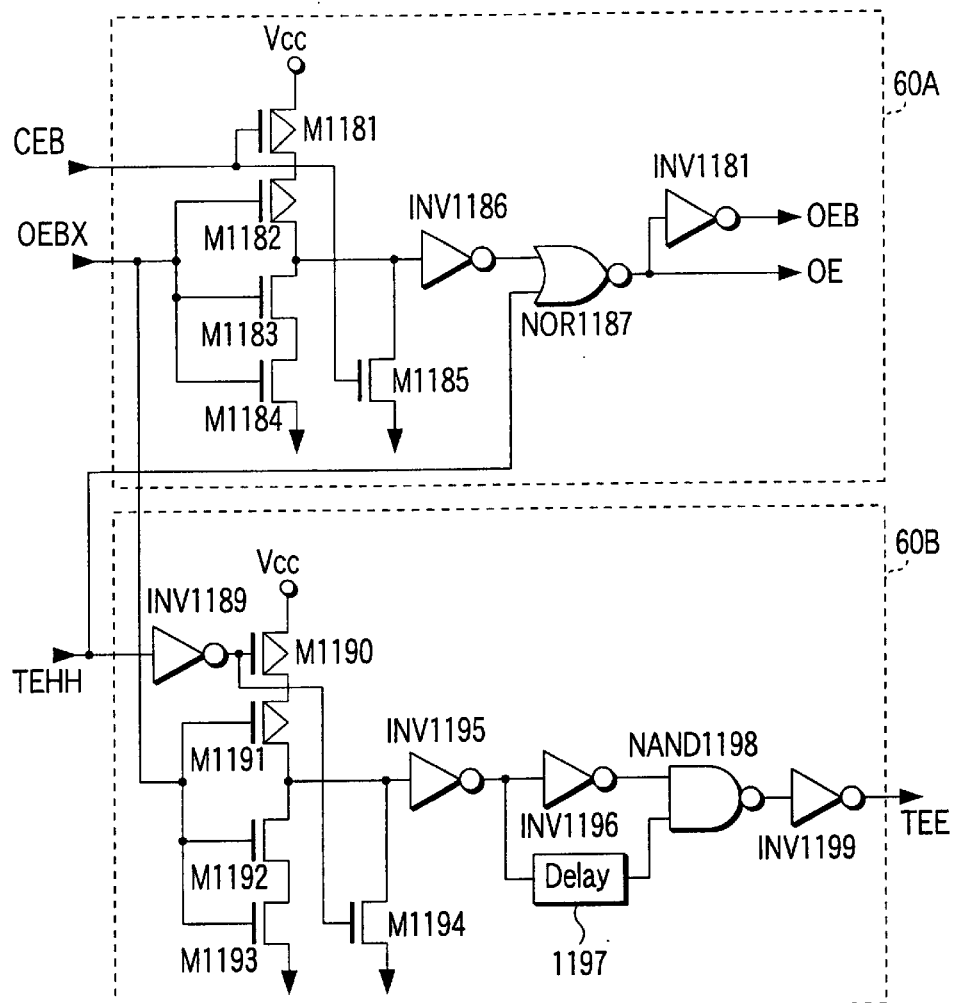
FIG. 23 is a circuit diagram of an output enable buffer in the fifth embodiment of the present invention.

FIG. 23 shows a concrete circuit of the output enable buffer 60. The output enable buffer 60 is constituted by an input buffer portion 60A for generating a control signal for controlling the readout, and an input buffer portion 60B for generating the test enable signal TEE during the test mode entry. The input buffer portion 60A is constituted by a NOR circuit composed of transistors M1181 to M1185, the first inverter INV1186, a NOR circuit NOR1187 to which the output from the inverter INV1186 and the control signal TEHH being the output signal from the high-voltage detection circuit 70 are inputted, and a second inverter INV1188.

The output signal CEB from the chip enable buffer 1, the external signal OEBX, the output control signal TEHH from the high-voltage detection circuit $4_2$ are inputted to the input buffer portion 60A, and the signals OE and OEB are outputted. The signal CEB is at the "L" level during the activities of the semiconductor storage apparatus, and is at the "H" level during the test mode entry since the external signal CEBX is at the "H" level. The signal OEBX signal is the external signal, and the signal TEHH is the signal that is outputted from the high-voltage detection circuit 7 and changes to the "H" level only during the test mode entry.

The input buffer portion 60B is constituted by a first inverter INV1189, a NOR circuit composed of transistors M1190 to M1194, a second inverter INV1195, a third inverter INV1196, a delay circuit DELAY1197, a NAND circuit NAND1198, and a fourth inverter INV1199. The output signal TEHH from the high-voltage detection circuit 70 is inputted to and the test enable signal TEE is outputted from the input buffer portion 60B.

During a normal operation, the signal TEHH is at the "L" level so that the output signal TEE from the input buffer portion 60B is fixed at the "L" level, and on the other hand, the output signals OE and OEB from the input buffer portion 60A become signals according to the external signal OEBX.

During the test mode entry, the signal TEHH is at the "H" level so that the output signal TEE from the input buffer portion 60B becomes the pulse signal according to the external signal OEBX, and on the other hand, the output signal OEB from the input buffer portion 60A is fixed at the "H" level while the output signal OE is fixed at the "L" level.

Figure 24:
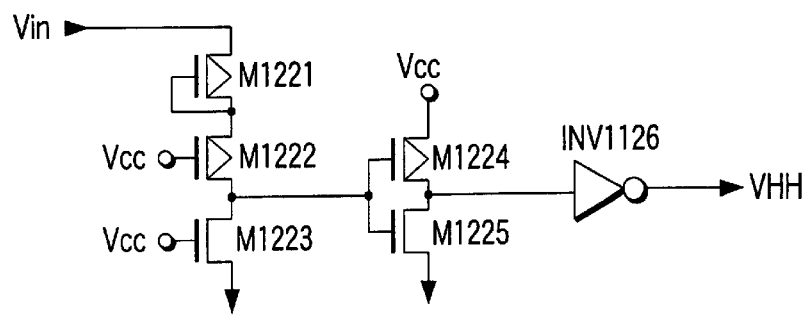
FIG. 24 is a circuit diagram of a high-voltage detection circuit in the fifth embodiment of the present invention.

FIG. 24 shows a concrete circuit of the high-voltage detection circuit 70.

The high-voltage detection circuit 70 is constituted by the first-stage circuit composed of transistors M1221 to M1223, an inverter composed of transistors M1224 and M1225, and an inverter INV1126 to which the output from the inverter composed of transistors M1224 and M1225 is inputted. The input signal Vin (it corresponds to the address A2 in FIG. 21) is inputted to and the signal VHH (it corresponds to the signal TEHH in FIG. 21) is outputted from the high-voltage detection circuit 70.

The output control signal TEHH from the high-voltage detection circuit 70 changes to the "H" level when the input address A2 is Vcc+Vthp or more, and changes to the "L" level when the input address A2 is below Vcc+Vthp (the Vthp is Vth of the PMOS). That is, the output control signal TEHH changes to the "H" level during the test mode entry, and sets the output enable buffer 60 to the test mode entry mode.

Moreover, although the address signals A1 and A2 function as addresses for memory cell selection during read-out/write-in operation, which is a normal operation of the semiconductor storage apparatus, they are inputted to the voltage detection circuit unit 4 and the high-voltage detection circuit 70 as entry signals during the test mode entry.

This embodiment also can prevent false operation that unintentionally sets the test mode in a similar manner to the first embodiment. In addition, in this embodiment, the output enable buffer 60 is used instead of the test enable buffer 2 in the semiconductor storage apparatus in the first embodiment so that an input pin and a test mode entry pin can be used in common, and there can be realized a circuit in which a useless power consumption does not occur irrelevantly to the status of the input signal.

(Sixth Embodiment)

An explanation will be given of a semiconductor storage apparatus according to a sixth embodiment of the present invention with reference to FIG. 25.

In a structural diagram of this embodiment shown in FIG. 25, the semiconductor storage apparatus comprises a semiconductor chip enable buffer 1, an output enable buffer 60, an address buffer 3, a first voltage detection circuit unit $4_1$, a second voltage detection circuit unit $4_2$, a decode circuit 6, a high-voltage detection circuit 70, a test mode entry setting circuit 7, a peripheral circuit 8, a memory cell drive circuit and memory cell 9, and a delay circuit 11. The memory cell may be composed of a semiconductor memory, and for example, a ferroelectric memory or a flash memory can be applied.

That is, in comparison with the semiconductor storage apparatus in the second embodiment, the output enable buffer 60 is provided instead of the test enable buffer 2, and the high-voltage detection circuit 70 is added.

The external signal OEBX is inputted to and the test enable signal TEE, the output enable signals OE and OEB are outputted from the output enable buffer 60. The test enable signal TEE is inputted to the test mode entry setting circuit 7, and the output enable signals OE and OEB are inputted to the peripheral circuit 8.

In this embodiment, the address A3 is inputted to and the control signal TEHH for controlling the output enable buffer 60 is outputted from the high-voltage detection circuit 70. The control signal TEHH is inputted to the output enable buffer 60. To the address buffer 3, the address A1 inputted to the first voltage detection circuit unit $4_1$, the address A2 inputted to the second voltage detection circuit unit $4_2$, the address A3 inputted to the high-voltage detection circuit 70, and the addresses A4 to Ai (i is a natural number) are inputted. A basic structure of the semiconductor storage apparatus in this embodiment is similar to that of the semiconductor storage apparatus in the second embodiment besides these structures.

FIG. 26 shows timing waveforms of main signals of this embodiment. As shown in FIG. 26, the waveform of the output enable signal OEBX corresponds to the waveform of the test enable signal TEBX in the second embodiment. That is, the input signal of the address signal A1 is at the HH and the input signal of the address signal A2 is at the HH at the first OEBX pulse of the output enable signal OEBX, the input signal of the address signal A1 is at the LL and the input signal of the address signal A2 is at the HH at the second OEBX pulse, the input signal of the address signal A1 is at the HH and the address signal A2 is at the LL at the third OEBX pulse, and the input signal of the address signal A1 is at the LL and the address signal A2 is at the LL at the fourth OEBX pulse.

A concrete circuit of the output enable buffer 60 is similar to that in the fifth embodiment, and is shown in FIG. 23. The output enable buffer 60 is constituted by an input buffer portion 60A for generating a control signal for controlling the read-out, and an input buffer portion 60B for generating the test enable signal TEE during the test mode entry.

The output signal CEB from the chip enable buffer 1, the external signal OEBX, the output control signal TEHH from the high-voltage detection circuit $4_2$ are inputted to the input buffer portion 60A, and the signals OE and OEB are outputted. The signal CEB is at the "L" level during the activities of the semiconductor storage apparatus, and is at the "H" level during the test mode entry since the external signal CEBX is at the "H" level. The signal OEBX signal is the external signal, and the signal TEHH is the signal that is outputted from the high-voltage detection circuit 70 and changes to the "H" level only during the test mode entry.

The output signal TEHH from the high-voltage detection circuit 43 is inputted to and the test enable signal TEE is outputted from the input buffer portion 60B.

During a normal operation, the signal TEHH is at the "L" level so that the output signal TEE from the input buffer portion 60B is fixed at the "L" level, and on the other hand, the output signals OE and OEB from the input buffer portion 60A become signals according to the external signal OEBX.

During the test mode entry, the signal TEHH is at the "H" level so that the output signal TEE from the input buffer portion 60B becomes the pulse signal according to the external signal OEBX, and on the other hand, the output signal OEB from the input buffer portion 60A is fixed at the "H" level while the output signal OE is fixed at the "L" level.

A concrete circuit of the high-voltage detection circuit 70 is similar to that in the fifth embodiment, and is shown in FIG. 24.

The input signal Vin (it corresponds to the address A3 in FIG. 25) is inputted to and the signal VHH (it corresponds to the signal TEHH in FIG. 25) is outputted from the high-voltage detection circuit 70. The output control signal TEHH from the high-voltage detection circuit 70 changes to the "H" level when the input address A2 is Vcc+Vthp or more, and changes to the "L" level when the input address A2 is Vcc+Vthp or less (the Vthp is Vth of the PMOS). That is, the output control signal TEHH changes to the "H" level during the test mode entry, and sets the output enable buffer 60 to the test mode entry mode.

Moreover, although the address signals A1, A2, and A3 function as addresses for memory cell selection during read-out/write-in operation, which is a normal operation of the semiconductor storage apparatus, they are inputted to the voltage detection circuit units $4_1$ and $4_2$ and the high-voltage detection circuit 70 respectively as entry signals during the test mode entry.

This embodiment also can prevent false operation that unintentionally sets the test mode in a similar manner to the second embodiment. In addition, in this embodiment, the output enable buffer 60 is used instead of the test enable buffer 2 in the semiconductor storage apparatus in the second embodiment so that an input pin and a test mode entry pin can be used in common, and there can be realized a circuit in which a useless power consumption does not occur irrelevantly to the status of the input signal.

(Seventh Embodiment)

An explanation will be given of a semiconductor storage apparatus according to a seventh embodiment of the present invention with reference to FIG. 27.

In a structural diagram of this embodiment shown in FIG. 27, the semiconductor storage apparatus comprises a semiconductor chip enable buffer 1, an output enable buffer 60, an address buffer 3, a first voltage detection circuit unit $4_1$, a second voltage detection circuit unit $4_2$, a high-voltage detection circuit 70, a decode circuit 30, a test mode entry setting circuit 7, a peripheral circuit 8, a memory cell drive circuit and memory cell 9, and a delay circuit 11. The semiconductor storage apparatus in this embodiment further comprises the test mode entry setting circuit 7, the peripheral circuit 8, and the memory cell drive circuit and memory cell 9 in the semiconductor storage apparatus in the third embodiment (refer to FIG. 13) even though they are not shown in figures in order to simplify the figures. The memory cell may be composed of a semiconductor memory, and for example, a ferroelectric memory or a flash memory can be applied.

That is, in comparison with the semiconductor storage apparatus in the third embodiment, the output enable buffer 60 is provided instead of the test enable buffer 2, and the high-voltage detection circuit 70 is added.

The external signal OEBX is inputted to and the test enable signal TEE, the output enable signals OE and OEB are outputted from the output enable buffer 60. The test enable signal TEE is inputted to the test mode entry setting circuit 7 (refer to FIG. 13), and the output enable signals OE and OEB are inputted to the peripheral circuit 8 (refer to FIG. 13).

In this embodiment, the address A3 is inputted to and the control signal TEHH for controlling the output enable buffer 60 is outputted from the high-voltage detection circuit 70. The control signal TEHH is inputted to the output enable buffer 60. To the address buffer 3, the address A1 inputted to the first voltage detection circuit unit $4_1$, the address A2 inputted to the second voltage detection circuit unit $4_2$, the address A3 inputted to the high-voltage detection circuit 70, and the addresses A4 to Ai (i is a natural number) are inputted. A basic structure of the semiconductor storage apparatus in this embodiment is similar to that of the semiconductor storage apparatus in the third embodiment besides these structures.

Figure 28:
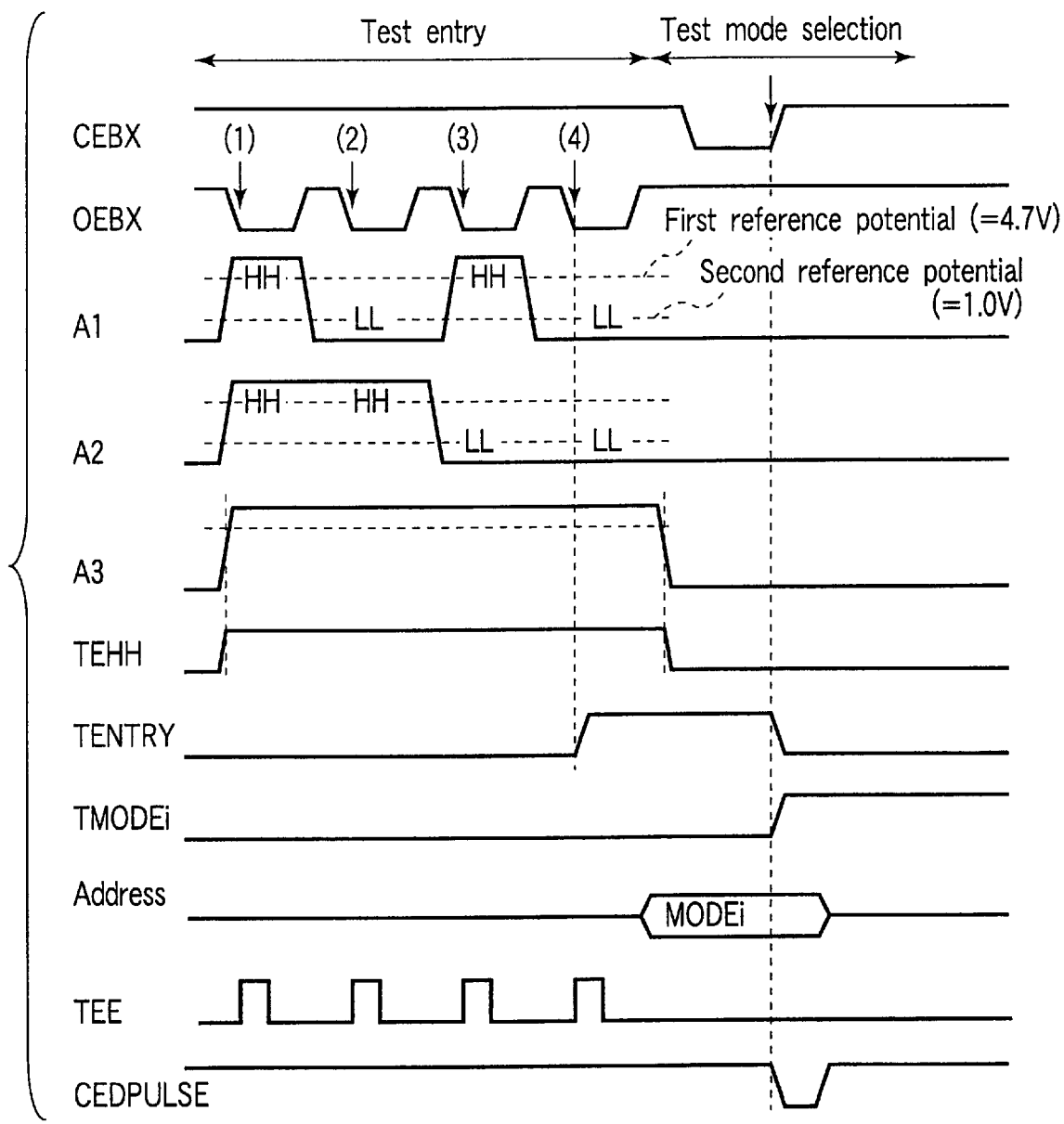
FIG. 28 is a timing waveform diagram of main signals in the seventh embodiment of the present invention.
Figure 30:
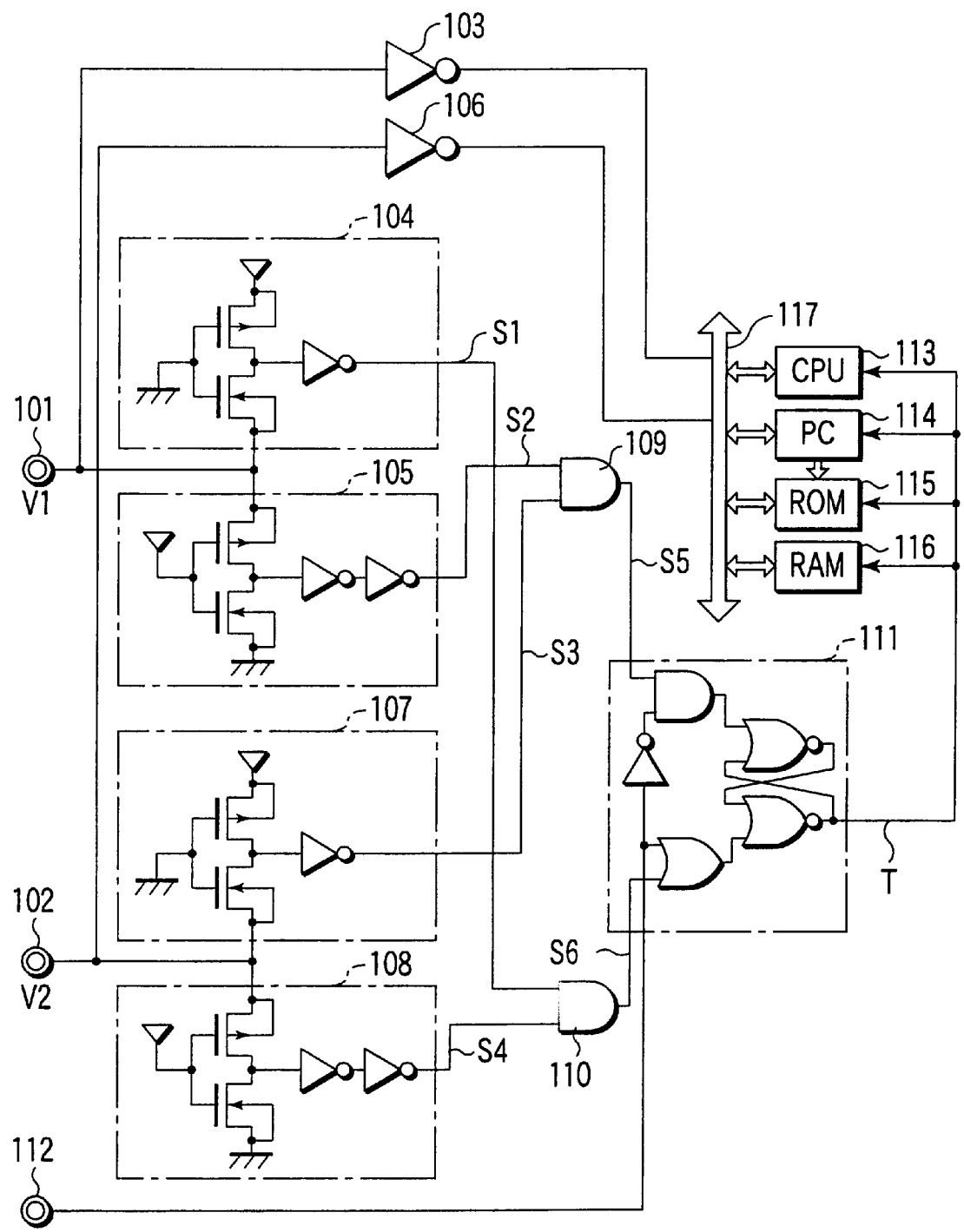
FIG. 30 is a structural diagram of a conventional semiconductor apparatus.

FIG. 28 shows timing waveforms of main signals of the seventh embodiment. The test enable pulse signal TEE is generated so as to be a rectangular-shaped wave pulse at the timing of making fall the pulse of the output enable signal OEBX under the test mode entry state. A pulse width of the test enable pulse signal TEE is set to, for example, about 20 ns.

The waveform of the output enable signal OEBX corresponds to the waveform of the test enable signal TEBX in the third embodiment. That is, the input signal of the address signal A1 is at the HH and the input signal of the address signal A2 is at the HH at the first OEBX pulse of the output enable signal OEBX, the input signal of the address signal A1 is at the LL and the input signal of the address signal A2 is at the HH at the second OEBX pulse, the input signal of the address signal A1 is at the HH and the input signal of the address signal A2 is at the LL at the third OEBX pulse, and the input signal of the address signal A1 is at the LL and the input signal of the address signal A2 is at the LL at the fourth OEBX pulse.

A concrete circuit of the output enable buffer 60 is the same as that in the fifth embodiment, and is shown in FIG. 23. The output enable buffer 60 is constituted by an input buffer portion 60A for generating a control signal for controlling the read-out, and an input buffer portion 60B for generating the test enable signal TEE during the test mode entry.

The output signal CEB from the chip enable buffer 1, the external signal OEBx, the output control signal TEHH from the high-voltage detection circuit 70 are inputted to the input buffer portion 60A, and the signals OE and OEB are outputted. The signal CEB is at the "L" level during the activities of the semiconductor storage apparatus, and is at the "H" level during the test mode entry since the external signal CEBX is at the "H" level. The signal OEBX signal is the external signal, and the signal TEHH is the signal that is outputted from the high-voltage detection circuit 7 and changes to the "H" level only during the test mode entry.

The output signal TEHH from the high-voltage detection circuit 70 is inputted to and the test enable signal TEE is outputted from the input buffer portion 60B.

During a normal operation, the signal TEHH is at the "L" level so that the output signal TEE from the input buffer portion 60B is fixed at the "L" level, and on the other hand, the output signals OE and OEB from the input buffer portion 60A become signals according to the external signal OEBX.

During the test mode entry, the signal TEHH is at the "H" level so that the output signal TEE from the input buffer portion 60B becomes the pulse signal according to the external signal OEBX, and on the other hand, the output signal OEB from the input buffer portion 60A is fixed at the "H" level while the output signal OE is fixed at the "L" level.

A concrete circuit of the high-voltage detection circuit 70 is similar to that in the fifth embodiment, and is shown in FIG. 24.

The input signal Vin (it corresponds to the address A3 in FIG. 27) is inputted to and the signal VHH (it corresponds to the signal TEHH in FIG. 27) is outputted from the output enable buffer 60.

The output control signal TEHH from the high-voltage detection circuit 70 changes to the "H" level when the input address A2 is Vcc+Vthp or more, and changes to the "L" level when the input address A2 is Vcc+Vthp or less (the Vthp is Vth of the PMOS). That is, the output control signal TEHH changes to the "H" level during the test mode entry, and sets the output enable buffer 60 to the test mode entry mode.

Moreover, although the address signals A1, A2, and A3 function as addresses for memory cell selection during read-out/write-in operation, which is a normal operation of the semiconductor storage apparatus, they are inputted to the voltage detection circuit units $4_1$ and $4_2$ and the high-voltage detection circuit 70 respectively as entry signals during the test mode entry.

This embodiment also can prevent false operation that unintentionally sets the test mode in a similar manner to the third embodiment. In addition, in this embodiment, the output enable buffer 60 is used instead of the test enable buffer 2 in the semiconductor storage apparatus in the third embodiment so that an input pin and a test mode entry pin can be used in common, and there can be realized a circuit in which a useless power consumption does not occur irrelevantly to the status of the input signal.

(Eighth Embodiment)

An explanation will be given of a semiconductor storage apparatus according to an eighth embodiment of the present invention with reference to FIG. 29.

In a structural diagram of this embodiment shown in FIG. 29, the semiconductor storage apparatus comprises a semiconductor chip enable buffer 1, an output enable buffer 60, an address buffer 3, a voltage detection circuit unit 40, a high-voltage detection circuit 70, a test mode entry setting circuit 7, a peripheral circuit 8, a memory cell drive circuit and memory cell 9, and a delay circuit 11. Concerning the semiconductor storage apparatus in this embodiment, the memory cell may be constituted by a semiconductor memory, and for example, a ferroelectric memory or a flash memory can be applied.

That is, in comparison with the semiconductor storage apparatus in the fifth embodiment, the voltage detection circuit unit 40 shown in FIG. 19 is used instead of the voltage detection circuit unit 4. The operation and an operation timing waveform in this embodiment are similar to those in the fifth embodiment so that the explanation thereof are omitted. Besides, the voltage detection circuit unit 40 shown in FIG. 19 can be used instead of the voltage detection circuit units 4, $4_1$ and $4_2$ in all the embodiments above in a similar manner to this embodiment.

This embodiment also can prevent false operation that unintentionally sets the test mode in a similar manner to the fourth embodiment. In addition, in this embodiment, the output enable buffer 60 is used instead of the test enable buffer 2 in the semiconductor storage apparatus in the fourth embodiment so that an input pin and a test mode entry pin can be used in common, and there can be realized a circuit in which a useless power consumption does not occur irrelevantly to the status of the input signal.

Moreover, although the address signals A1 and A2 function as addresses for memory cell selection during read-out/write-in operation, which is a normal operation of the semiconductor storage apparatus, they are inputted to the voltage detection circuit unit 40 and the high-voltage detection circuit 70 as entry signals during the test mode entry.

Besides, a structure of the test mode entry setting circuit explained in each of the embodiments is an example, and for example, the test mode entry setting circuits shown in the first embodiment and in the second embodiment can be replaced with each other. Moreover, it is possible to use an appropriately designed circuit can be used as the test mode entry setting circuit as long as it has a structure with a similar function to that of the test mode entry setting circuit shown in each of the embodiments.

Besides, although the cases of the semiconductor storage apparatus is explained in the embodiments above, this invention is not limited to a semiconductor storage apparatus, or is not limited to test mode setting. This invention can be applied to an MPU in which setting for specific modes such as a test mode is required, or to a logic LSI such as a semi-custom LSI.

Moreover, although the two reference potential levels "H" and "L" is compared with the level of the input signal, and a judgment is made as a function of the voltage detection circuit unit in each of the embodiments above, a number of the reference potential levels does not necessarily have to be two. The false setting can be prevented from being occurred more efficiently by providing plural voltage detection circuit units whose number is equivalent to a number of the reference potential levels, by providing two or more reference potential levels, and by judging the level of the input signal at many stages so that mode setting becomes more complicated.

According to this invention, concerning a semiconductor apparatus having a normal operation mode and specific modes such as a test mode, there can be provided the semiconductor apparatus that does not falsely enter the specific mode during normal operation, guarantees stable operation during the normal operation, and sets to the specific mode for sure when the specific mode is set, and a mode setting method for the semiconductor apparatus.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor apparatus comprising:
   a first voltage detection circuit to which an input signal is inputted, configured to judge whether a potential of the input signal is higher or lower than a first reference potential, and output a first level signal if the potential of the input signal is judged to be higher;
   a second voltage detection circuit to which the input signal is inputted, configured to judge whether the potential of the input signal is higher or lower than a second reference potential, and output a second level signal if the potential of the input signal is judged to be lower; and
   an operation mode entry setting circuit configured to judge plural times whether or not output signals from the first and second voltage detection circuits coincide with predetermined levels in synchronization with an input clock signal, and make an enter of an operation mode if all of the judged-results show that the output signals coincide with the predetermined levels.

2. A semiconductor apparatus according to claim 1, further comprising a filter circuit connected to the first and the second voltage detection circuits, to which the output signals from the first and the second voltage detection circuits are inputted while a second input signal is inputted, configured to output the output signals from the first and the second voltage detection circuits on the basis of the second input signal, wherein the operation mode entry setting circuit is configured to judge plural times whether or not the output signals from the first and second voltage detection circuits outputted from the filter circuit coincide with the predetermined levels in synchronization with the input clock signal, and make the enter of the operation mode if all of the judge-results show that the signals coincide with the predetermined levels.

3. The semiconductor apparatus according to claim 2, further comprising an output enable buffer and a high-voltage detection circuit, wherein the high-voltage detection circuit is configured to be inputted with a third input signal to output a control signal when the third input signal has a predetermined voltage or more, and the output enable buffer is configured to receive an external enable signal and the control signal from the high-voltage detection circuit to output in an active mode a voltage detecting enable signal to the first and the second voltage detection circuits.

4. The semiconductor apparatus according to claim 2, wherein the input signals are in a form of a part of an address signal.

5. The semiconductor apparatus according to claim 3, wherein the part of the address signal is used as an address signal for selecting the memory cell during read/write operation in a normal mode.

6. The semiconductor apparatus according to claim 1, wherein the second reference potential is higher than ground potential.

7. The semiconductor apparatus according to claim 6, further comprising an output enable buffer and a high-voltage detection circuit, wherein the high-voltage detection circuit is configured to be inputted with a third input signal to output a control signal when the third input signal has a predetermined voltage or more, and the output enable buffer is configured to receive an external enable signal and the control signal from the high-voltage detection circuit to output in an active mode a voltage detecting enable signal to the first and the second voltage detection circuits.

8. The semiconductor apparatus according to claim 1, further comprising a test enable buffer configured to receive an external control signal to output in an active mode a voltage detecting enable signal to the first and the second voltage detection circuits.

9. The semiconductor apparatus according to claim 8, wherein the test enable buffer is a buffer exclusively used for testing.

10. The semiconductor apparatus according to claim 1, further comprising an output enable buffer abnd a high-voltage detection circuit, wherein the high-voltage detection circuit is configured to be inputted with a second input signal to output a control signal when the second in put signal has a predetermined voltage or more, and the output enable buffer is configured to receive an external enable signal and the control signal from the high-voltage detection circuit to output in an active mode a voltage detecting enable signal to the first and the second voltage detection circuits.

11. The semiconductor apparatus according to claim 1, wherein the operation mode entry setting circuit comprises latch circuits configured to judge the operation mode entry, the latch circuits being connected in series to each other with stages whose number corresponds to the number of judging the output signal.

12. The semiconductor apparatus according to claim 1, wherein a sort of the operation mode is set on the basis of an address signal when the entry of the operation mode is made.

13. The semiconductor apparatus according to claim 1, further comprising a memory cell to and from data is write and read, wherein the memory cell is configured to be set to a test mode when the entry of the operation mode is made.

14. The semiconductor apparatus according to claim 1, wherein the input signal is in a form of a part of an address signal.

15. The semiconductor apparatus according to claim 14, wherein the part of the address signal is used as an address signal for selecting the memory cell during read/write operation in a normal mode.

16. The semiconductor apparatus according to claim 1, wherein the voltage detection circuits each comprise a signal input portion and a signal output portion driven with an external power potential.

17. The semiconductor apparatus according to claim 1, wherein the voltage detection circuits each comprise a signal input portion driven with an external power potential and a signal output portion driven with an internal power supply potential in a form of voltage-reduction of an external power supply potential.

18. A semiconductor apparatus comprising:
   a first voltage detection circuit to which a first input signal is inputted, configured to judge whether a potential of the input signal is higher or lower than a first reference potential, and output a first level signal if the potential of the input signal is judged to be higher;
   a second voltage detection circuit to which the first input signal is inputted, configured to judge whether the potential of the input signal is higher or lower than a second reference potential, and output a second level signal if the potential of the input signal is judged to be lower;
   a third voltage detection circuit to which a second input signal is inputted, configured to judge whether the potential of the input signal is higher or lower than the first reference potential, and output the first level signal if the potential of the input signal is judged to be higher;
   a fourth voltage detection circuit to which the second input signal is inputted, configured to judge whether the potential of the input signal is higher or lower than the second reference potential, and output the second level signal if the potential of the input signal is judged to be lower; and
   an operation mode entry setting circuit configured to judge plural times whether or not the output signals from the first to fourth voltage detection circuits coincide with predetermined levels in synchronization with an input clock signal, and make an enter of an operation mode if all of the judged-results show that the output signals coincide with the predetermined levels.

19. The semiconductor apparatus according to claim 18, further comprising:
   a first filter circuit connected to the first and the second voltage detection circuits, to which the output signals from the first and the second voltage detection circuits are inputted while a third input signal is inputted, configured to output the output signals from the first and the second voltage detection circuits on the basis of the third input signal; and a second filter circuit connected to the third and the fourth voltage detection circuits, to which the output signals from the third and the fourth voltage detection circuits are inputted while the third input signal is inputted, configured to output the output signals from the third and the fourth voltage detection circuits on the basis of the third input signal, wherein the operation mode entry setting circuit is configured to judge plural times whether or not the output signals from the first to fourth voltage detection circuits outputted from the first and the second filter circuits coincide with the predetermined levels in synchronization with the input clock signal, and make the enter of the operation mode if all of the judged-results show that the signals coincide with the predetermined levels.

20. The semiconductor apparatus according to claim 19, further comprising an output enable buffer and a high-voltage detection circuit, wherein the high-voltage detection circuit is configured to be inputted with a fourth input signal to output a control signal when the fourth input signal has a predetermined voltage or more, and the output enable buffer is configured to receive an external enable signal and the control signal from the high-voltage detection circuit to output in an active mode a voltage detecting enable signal to the first to the fourth voltage detection circuits.

21. The semiconductor apparatus according to claim 18, wherein the second reference potential is higher than ground potential.

22. The semiconductor apparatus according to claim 21, further comprising an output enable buffer and a high-voltage detection circuit, wherein the high-voltage detection circuit is configured to be inputted with a fourth input signal to output a control signal when the fourth input signal has a predetermined voltage or more, and the output enable buffer is configured to receive an external enable signal and the control signal from the high-voltage detection circuit to output in an active mode a voltage detecting enable signal to the first to the fourth voltage detection circuits.

23. The semiconductor apparatus according to claim 18, further comprising a test enable buffer configured to receive an external control signal to output in an active mode a voltage detecting enable signal to the first to fourth voltage detection circuits.

24. The semiconductor apparatus according to claim 23, wherein the test enable buffer is a buffer exclusively used for testing.

25. The semiconductor apparatus according to claim 18, further comprising an output enable buffer and a high-voltage detection circuit, wherein the high-voltage detection circuit is configured to be inputted with a third input signal to output a control signal when the third input signal has a predetermined voltage or more, and the output enable buffer is configured to receive an external enable signal and the control signal from the high-voltage detection circuit to output in an active mode a voltage detecting enable signal to the first and the second voltage detection circuits.

26. The semiconductor apparatus according to claim 18, wherein the operation mode entry setting circuit comprises latch circuits configured to judge the operation mode entry, the latch circuits being connected in series to each other with stages whose number corresponds to the number of judging the output signal.

27. The semiconductor apparatus according to claim 18, wherein a sort of the operation mode is set on the basis of an address signal when the entry of the operation mode is made.

28. The semiconductor apparatus according to claim 18, further comprising a memory cell to and from data is write and read, wherein the memory cell is configured to be set to a test mode when the entry of the operation mode is made.

29. The semiconductor apparatus according to claim 18, wherein the first and the second input signals are in a form of a part of an address signal.

30. The semiconductor apparatus according to claim 29, wherein the part of the first and second address signals are used as an address signal for selecting the memory cell during read/write operation in a normal mode.

31. The semiconductor apparatus according to claim 18, wherein the voltage detection circuits each comprise a signal input portion and a signal output portion driven with an external power potential.

32. The semiconductor apparatus according to claim 18, wherein the voltage detection circuits each comprise a signal input portion driven with an external power potential and a signal output portion driven with an internal power supply potential in a form of voltage-reduction of an external power supply potential.

33. A semiconductor apparatus comprising:

a first voltage detection circuit to which a first input signal is inputted, configured to judge whether a potential of the input signal is higher or lower than a first reference potential, and output a first level signal if the potential of the input signal is judged to be higher;

a second voltage detection circuit to which the first input signal is inputted, configured to judge whether the potential of the input signal is higher or lower than a second reference potential, and output a second level signal if the potential of the input signal is judged to be lower;

a filter circuit connected to the first and the second voltage detection circuits, to which the output signals from the first and the second voltage detection circuits are inputted while a second input signal is inputted, configured to output the output signals from the first and the second voltage detection circuits on the basis of the second input signal; and an operation mode entry setting circuit configured to judge plural times whether or not the output signals from the first and second voltage detection circuits outputted from the filter circuit coincide with predetermined levels in synchronization with an input clock signal, and make an enter of an operation mode if all of the judged-results show that the signals coincide with the predetermined levels.

34. The semiconductor apparatus according to claim 33, further comprising a test enable buffer configured to receive an external control signal to output in an active mode a voltage detecting enable signal to the first and the second voltage detection circuits.

35. The semiconductor apparatus according to claim 33, further comprising an output enable buffer and a high-voltage detection circuit, wherein the high-voltage detection circuit is configured to be inputted with a third input signal to output a control signal when the third input signal has a predetermined voltage or more, and the output enable buffer is configured to receive an external enable signal and the control signal from the high-voltage detection circuit to output in an active mode a voltage detecting enable signal to the first and the second voltage detection circuits.

36. A semiconductor apparatus comprising:

a first voltage detection circuit to which a first input signal is inputted, configured to judge whether a potential of the input signal is higher or lower than a first reference potential, and output a first level signal if the potential of the input signal is judged to be higher;

a second voltage detection circuit to which the first input signal is inputted, configured to judge whether the potential of the input signal is higher or lower than a second reference potential, and output a second level signal if the potential of the input signal is judged to be lower;

a third voltage detection circuit to which a second input signal is inputted, configured to judge whether the potential of the input signal is higher or lower than the first reference potential, and output the first level signal if the potential of the input signal is judged to be higher;

a fourth voltage detection circuit to which the second input signal is inputted, configured to judge whether the potential of the input signal is higher or lower than the second reference potential, and output the second level signal if the potential of the input signal is judged to be lower;

a first filter circuit connected to the first and the second voltage detection circuits, to which a output signals from the first and the second voltage detection circuits are inputted while a third input signal is inputted, configured to output the output signals from the first and the second voltage detection circuits on the basis of the third input signal;

a second filter circuit connected to the third and the fourth voltage detection circuits, to which a output signals from the third and the fourth voltage detection circuits are inputted while the third input signal is inputted, configured to output the output signals from the third and the fourth voltage detection circuits on the basis of the third input signal; and an operation mode entry setting circuit configured to judge plural times whether or not the output signals from the first to fourth voltage detection circuits outputted from the first and the second filter circuits coincide with predetermined levels in synchronization with an input clock signal, and make an enter of an operation mode if all of the judged-results show that the signals coincide with the predetermined levels.

37. The semiconductor apparatus according to claim 36, further comprising a test enable buffer configured to receive an external control signal to output in an active mode a voltage detecting enable signal to the first to fourth voltage detection circuits.

38. The semiconductor apparatus according to claim 36, further comprising an output enable buffer and a high-voltage detection circuit, wherein the high-voltage detection circuit is configured to be inputted with a fourth input signal to output a control signal when the fourth input signal has a predetermined voltage or more, and the output enable buffer is configured to receive an external enable signal and the control signal from the high-voltage detection circuit to output in an active mode a voltage detecting enable signal to the first to the fourth voltage detection circuits.

39. A semiconductor apparatus comprising:

a first voltage detection circuit to which a first input signal is inputted, configured to judge whether a potential of the input signal is higher or lower than a first reference potential, and output a first level signal if the potential of the input signal is judged to be higher;

a second voltage detection circuit to which the first input signal is inputted, configured to judge whether the potential of the input signal is higher or lower than a second reference potential, and output a second level signal if the potential of the input signal is judged to be lower;

a filter circuit connected to the first and the second voltage detection circuits, to which the output signals from the first and the second voltage detection circuits are inputted while the second input signal is inputted, configured to output the output signals from the first and the second voltage detection circuits on the basis of the second input signal; and an operation mode entry setting circuit configured to make an enter of an operation mode on the basis of the output signal from the filter circuits.

40. The semiconductor apparatus according to claim 39, further comprising a test enable buffer configured to receive an external control signal to output in an active mode a voltage detecting enable signal to the first and the second voltage detection circuits.

41. The semiconductor apparatus according to claim 39, further comprising an output enable buffer and a high-voltage detection circuit, wherein the high-voltage detection circuit is configured to be inputted with a third input signal to output a control signal when the third input signal has a predetermined voltage or more, and the output enable buffer is configured to receive an external enable signal and the control signal from the high-voltage detection circuit to output in an active mode a voltage detecting enable signal to the first and the second voltage detection circuits.

42. A semiconductor apparatus comprising:

a first voltage detection circuit to which a first input signal is inputted, configured to judge whether a potential of the input signal is higher or lower than a first reference potential, and output a first level signal if the potential of the input signal is judged to be higher;

a second voltage detection circuit to which the first input signal is inputted, configured to judge whether the potential of the input signal is higher or lower than a second reference potential, and output the second level signal if the potential of the input signal is judged to be lower;

a third voltage detection circuit to which a second input signal is inputted, configured to judge whether the potential of the input signal is higher or lower than the first reference potential, and output the first level signal if the potential of the input signal is judged to be higher;

a fourth voltage detection circuit to which the second input signal is inputted, configured to judge whether the potential of the input signal is higher or lower than the second reference potential, and output the second level signal if the potential of the input signal is judged to be lower;

a first filter circuit connected to the first and the second voltage detection circuits, to which the output signals from the first and the second voltage detection circuits are inputted while a third input signal is inputted, configured to output the output signals from the first and the second voltage detection circuits on the basis of the third input signal;

a second filter circuit connected to the third and the fourth voltage detection circuits, to which the output signals from the third and the fourth voltage detection circuits are inputted while the third input signal is inputted, configured to output the output signals from the third and the fourth voltage detection circuits on the basis of the third input signal; and an operation mode entry setting circuit configured to make an entry of a specific operation mode on the basis of the output signal from the first and the second filter circuits.

43. The semiconductor apparatus according to claim 42, further comprising a test enable buffer configured to receive an external control signal to output in an active mode a voltage detecting enable signal to the first to fourth voltage detection circuits.

44. The semiconductor apparatus according to claim 42, further comprising an output enable buffer and a high-voltage detection circuit, wherein the high-voltage detection circuit is configured to be inputted with a fourth input signal to output a control signal when the fourth input signal has a predetermined voltage or more, and the output enable buffer is configured to receive an external enable signal and the control signal from the high-voltage detection circuit to output in an active mode a voltage detecting enable signal to the first to the fourth voltage detection circuits.

45. A semiconductor apparatus comprising:

a voltage detection circuit to which an input signal is inputted, configured to judge whether a potential of the input signal is higher or lower than a predetermined reference potential, output a first level signal if the potential of the input signal is judged to be higher, and output a second level signal if the potential of the input signal is judged to be lower; and an operation mode entry setting circuit configured to judge plural times whether or not the output signal from the voltage detection circuit coincides with predetermined levels in synchronization with an input clock signal, and make an enter of an operation mode if all of the judged-results show that the signal coincides with the predetermined levels.

46. A mode setting method for a semiconductor apparatus comprising:

judging plural times whether or not a relation in level between first and second reference potentials and an input signal potential coincides with a predetermined condition in synchronization with an input clock signal, and executing a mode entry operation if all of the judged-results show that the relation coincides with the predetermined condition; and selecting an operation mode on the basis of an mode selection signal after the mode entry operation.

* * * * *